United States Patent
Itakura

(10) Patent No.: US 11,246,220 B2
(45) Date of Patent: Feb. 8, 2022

(54) PHYSICAL QUANTITY DETECTOR

(71) Applicant: DENSO CORPORATION, Kariya (JP)

(72) Inventor: Keisuke Itakura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/950,352

(22) Filed: Nov. 17, 2020

(65) Prior Publication Data

US 2021/0153356 A1 May 20, 2021

(30) Foreign Application Priority Data

Nov. 19, 2019 (JP) .............................. JP2019-208844

(51) Int. Cl.
*H05K 5/00* (2006.01)
*H05K 1/18* (2006.01)
*H05K 1/02* (2006.01)

(52) U.S. Cl.
CPC ............ *H05K 1/189* (2013.01); *H05K 1/028* (2013.01); *H05K 5/0026* (2013.01); *H05K 2201/0212* (2013.01); *H05K 2201/0314* (2013.01); *H05K 2201/068* (2013.01); *H05K 2201/0999* (2013.01)

(58) Field of Classification Search
CPC .......................................... H05K 5/0026–006
See application file for complete search history.

(56) References Cited

U.S. PATENT DOCUMENTS

2018/0306619 A1   10/2018   Uenodan et al.

FOREIGN PATENT DOCUMENTS

| JP | 2018-179613 | 11/2018 |
|----|-------------|---------|
| JP | 6433407 | 12/2018 |
| JP | 6436925 | 12/2018 |
| JP | 6474709 | 2/2019 |
| JP | 6524017 | 6/2019 |
| JP | 6527483 | 6/2019 |

*Primary Examiner* — Jeremy C Norris
(74) *Attorney, Agent, or Firm* — Nixon & Vanderhye P.C.

(57) ABSTRACT

A physical quantity detector includes a housing, a circuit board, a cover, a resin member, a conductor, and a conductive member. The circuit board includes a board surface. The cover faces the board surface and defines, together with the hosing, a passage through which the target fluid flows. The conductor includes a passage side portion and a connecting portion. The conductive member electrically connects the connecting portion to the circuit board. The conductive member includes a first end in the thickness direction facing a contact target that is either one of the connecting portion or the board surface. The first end includes a contact portion in contact with the contact target and a contactless portion away from the contact target in the thickness direction.

17 Claims, 29 Drawing Sheets

PHYSICAL QUANTITY DETECTOR

CROSS REFERENCE TO RELATED APPLICATION

This application is based on Japanese Patent Application No. 2019-208844 filed on Nov. 19, 2019, the disclosure of which is incorporated herein by reference in its entirety.

TECHNICAL FIELD

The present disclosure relates to a physical quantity detector configured to detect a physical quantity of a target fluid.

BACKGROUND

A physical quantity detector includes a housing, a cover, a flow rate detecting element, and a circuit board. The housing and the cover define a passage and the flow rate detecting element is disposed in the passage. Electrical members such as the flow rate detecting element are mounted on the circuit board. The physical quantity detector is configured to detect a flow rate that is a physical quantity of a fluid flowing through the passage with the flow rate detecting element.

SUMMARY

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor includes a passage side portion disposed in the passage and a connecting portion disposed to face the board surface of the circuit board in the thickness direction. The conductive member is inserted and fit into the resin member in the thickness direction. The conductive member electrically connects the connecting portion to the circuit board by being disposed between the connecting portion and the circuit board to be in contact with both the connecting portion and the circuit board. The conductive member includes a first end in the thickness direction facing a contact target that is one of the connecting portion or the board surface. The first end includes a contact portion that is in contact with the contact target and a contactless portion that is distanced away from the contact portion in the thickness direction.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor is fixed to the cover and includes a passage side portion disposed in the passage and a connecting portion disposed to face the board surface of the circuit board in the thickness direction. The conductive member is inserted and fit into the resin member in the thickness direction. The conductive member electrically connects the connecting portion to the circuit board by being disposed between the connecting portion and the circuit board to be in contact with both the connecting portion and the circuit board. The cover is configured to allow the connecting portion of the conductor to be bent in the thickness direction away from the circuit board.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor is fixed to the cover and includes a passage side portion disposed in the passage and a connecting portion defining a connecting hole passing through the connecting portion between a first surface facing away from the circuit board and a second surface facing the circuit board in the thickness direction. The connecting portion is disposed to face the board surface of the circuit board in the thickness direction. The conductive member is inserted into the resin member and electrically connects the connecting portion to the circuit board. The conductive member includes a conductive solidified portion joined to both the connecting portion and the circuit board by being solidified in a space between the connecting portion and the circuit board. The conductive solidified portion is inserted into the connecting hole and protrudes from the first surface of the connecting portion in the thickness direction.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor includes a passage side portion disposed in the passage and a connecting portion disposed to face the board surface of the circuit board in the thickness direction. The conductive member is inserted and fit into the resin member in the thickness direction. The conductive member electrically connects the connecting portion to the circuit board by being disposed between the connecting portion and the circuit board to be in contact with both the connecting portion and the circuit board. The conductive member has at least a part distanced away from the resin member.

DESCRIPTION OF EMBODIMENTS

Figure 1:
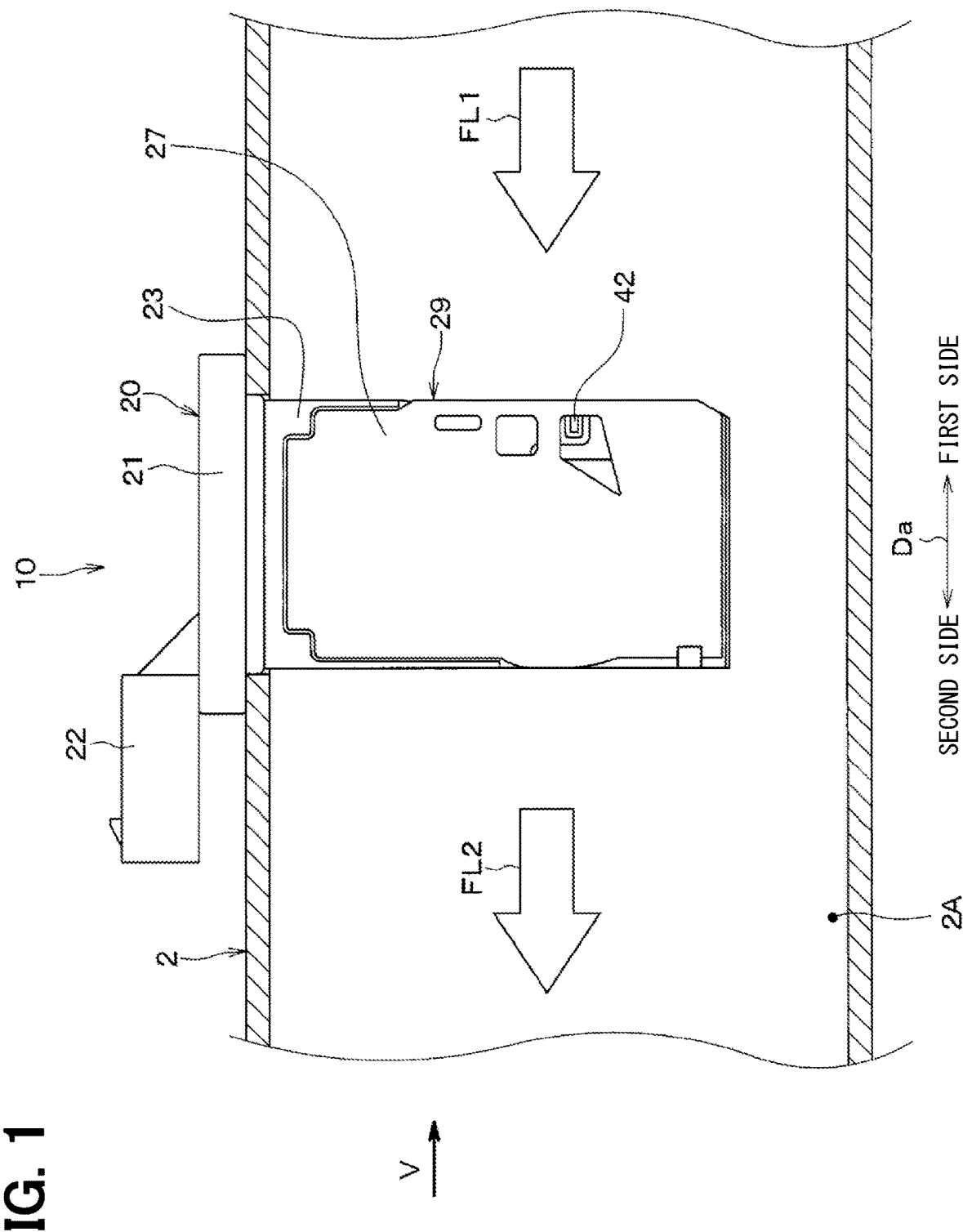
FIG. 1 is a front view of a physical quantity detector in a first embodiment viewed from a second side of the physical quantity in a thickness direction with a cross-sectional view of an intake pipe on which the physical quantity detector is mounted.

To begin with, examples of relevant techniques will be described.

A physical quantity detector including a housing, a cover, a flow rate detecting element, and a circuit board has been known. The housing and the cover define a passage and the flow rate detecting element is disposed in the passage. Electrical members such as the flow rate detecting element are mounted on the circuit board. The physical quantity detector is configured to detect a flow rate that is a physical quantity of a fluid flowing through the passage with the flow rate detecting element.

The physical quantity detector includes a conductor integrally fixed to the cover. The conductor extends in the passage in which the flow rate detecting element is disposed to a predetermined position overlapping with the circuit board. The conductor is electrically connected to a ground circuit of the circuit board through a conductive member.

In detail, the conductive member is pressed between the conductor and the circuit board and in contact with both the conductor and the circuit board to secure an electrical connection between the conductor and the circuit board.

When a temperature of the conductive member is increased in the physical quantity detector, the conductive element attempts to expand. However, since the conductive member is compressed between and in contact with the conductor and the circuit board as described above, the conductive member is prevented from expanding by the conductor and the circuit board, which generates a thermal stress on the conductive member.

The thermal stress of the conductive member affects the conductive member itself and peripheral members of the conductive member. For example, a reliability of the electrical connection between the conductive member and the conductor or a reliability of the electrical connection between the conductive member and the circuit board may be damaged. The above-described facts have been found by the inventors of the present disclosure.

In view of the above points, it is objective of the present disclosure to provide a physical quantity detector that can improve a reliability of an electrical connection between the conductor and the circuit board through the conductive member.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor includes a passage side portion disposed in the passage and a connecting portion disposed to face the board surface of the circuit board in the thickness direction. The conductive member is inserted and fit into the resin member in the thickness direction. The conductive member electrically connects the connecting portion to the circuit board by being disposed between the connecting portion and the circuit board to be in contact with both the connecting portion and the circuit board. The conductive member includes a first end in the thickness direction facing a contact target that is one of the connecting portion or the board surface. The first end includes a contact portion that is in contact with the contact target and a contactless portion that is distanced away from the contact portion in the thickness direction.

Thus, even if the conductive member expands or contracts according to a temperature change, the expansion and the contraction of the conductive member can be released at the first end of the conductive member. Therefore, a stress applied to the conductor and the circuit board from the conductive member along with the temperature change is relaxed and a reliability of the electrical connection between the conductor and the circuit board through the conductive member can be improved.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor is fixed to the cover and includes a passage side portion disposed in the passage and a connecting portion disposed to face the board surface of the circuit board in the thickness direction. The conductive member is inserted and fit into the resin member in the thickness direction. The conductive member electrically connects the connecting portion to the circuit board by being disposed between the connecting portion and the circuit board to be in contact with both the connecting portion and the circuit board. The cover is configured to allow the connecting portion of the conductor to be bent in the thickness direction away from the circuit board.

Thus, even when the conductive member expands or contracts according to a temperature change, the expansion and the contraction can be released by bending the conductor. Therefore, a stress applied to the conductor and the circuit board from the conductive member along with the temperature change is relaxed and a reliability of the electrical connection between the conductor and the circuit board through the conductive member can be improved.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor is fixed to the cover and includes a passage side portion disposed in the passage and a connecting portion defining a connecting hole passing through the connecting portion between a first surface facing away from the circuit board and a second surface facing the circuit board in the thickness direction. The connecting portion is disposed to face the board surface of the circuit board in the thickness direction. The conductive member is inserted into the resin member and electrically connects the connecting portion to the circuit board. The conductive member includes a conductive solidified portion joined to both the connecting portion and the circuit board by being solidified in a space between the connecting portion and the circuit board. The conductive solidified portion is inserted into the connecting hole and protrudes from the first surface of the connecting portion in the thickness direction.

Since the conductive member is accurately in contact with both the conductor and the circuit board with the configuration described above, a reliability of the electrical connection between the conductor and the circuit board through the conductive member can be improved.

A physical quantity detector is configured to detect a physical quantity of a target fluid. The physical quantity detector includes a housing, a circuit board, a cover, a resin member, a conductor, and a conductive member. The circuit board is disposed in the housing and includes a board surface facing in a thickness direction of the circuit board. The cover is disposed to face the board surface of the circuit board in the thickness direction and defines a passage, together with the housing, through which the target fluid flows. The resin member is disposed between the cover and the circuit board and covers the circuit board. The conductor includes a passage side portion disposed in the passage and a connecting portion disposed to face the board surface of the circuit board in the thickness direction. The conductive member is inserted and fit into the resin member in the thickness direction. The conductive member electrically connects the connecting portion to the circuit board by being disposed between the connecting portion and the circuit board to be in contact with both the connecting portion and the circuit board. The conductive member has at least a part distanced away from the resin member.

Thus, even if the conductive member expands or contracts according to a temperature change, the expansion and the contraction can be released at the at least the part of the conductive member distanced away from the resin member. Therefore, a stress applied to the conductor and the circuit board from the conductive member along with the temperature change is relaxed and a reliability of the electrical connection between the conductor and the circuit board through the conductive member can be improved.

Hereinafter, embodiments will be described with reference to the drawings. In the following embodiments, the same reference numeral is given to the same or equivalent parts in the drawings.

First Embodiment

In a first embodiment, a physical quantity detector 10 is applied for a control system of an internal combustion engine configured to control the internal combustion engine. The physical quantity detector 10 in this embodiment is configured to detect various physical quantities such as a flow rate of a target fluid. In this embodiment, the target fluid is an intake air supplied into the internal combustion engine. The control system for the internal combustion engine controls the flow rate of the target fluid supplied to the internal combustion engine (not shown), an amount of fuel, an ignition timing, and the like according to detecting results of the physical quantity detector 10.

Figure 2:
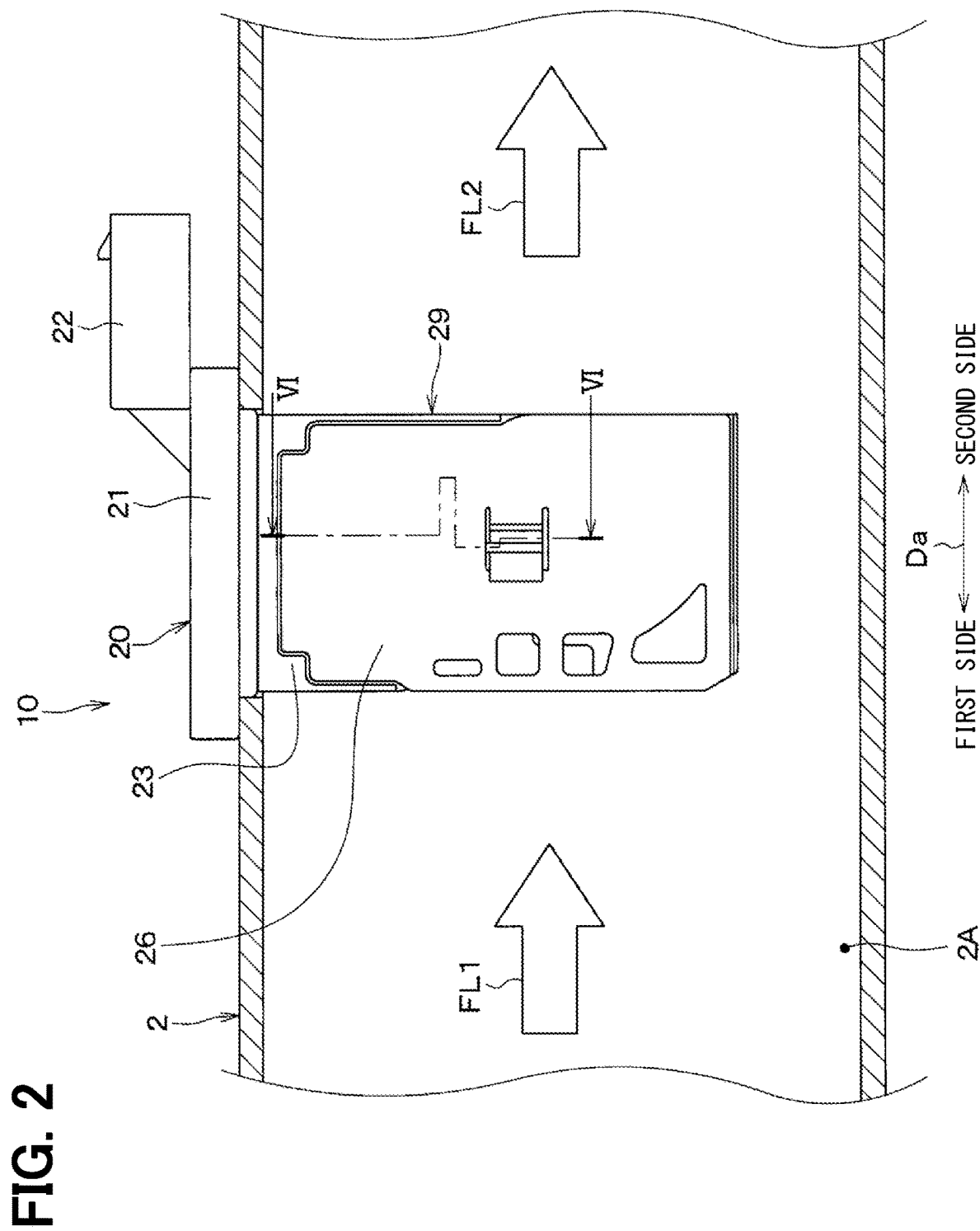
FIG. 2 is a back view of the physical quantity detector in the first embodiment viewed from a first side of the physical quantity detector in the thickness direction with a cross sectional view of the intake pipe (i.e., a view of the physical quantity detector and the intake pipe viewed in a direction opposite to a direction of FIG. 1).

As shown in FIGS. 1 and 2, the physical quantity detector 10 is attached to an intake pipe 2 through which the target fluid flows. The intake pipe 2 has a cylindrical hollow shape and defines a main passage 2A through which an air as the target fluid flows. That is, the main passage 2A extends in an extending direction Da of the main passage 2A and a first side and a second side of the physical quantity detector 10 is defined in the extending direction Da. The target fluid flows from the first side that is an upstream side in a flow direction of the target fluid to the second side that is a downstream side in the flow direction of the target fluid. The intake pipe 2 is not limited to the cylindrical hollow shape and may be a rectangular hollow shape.

Figure 3:
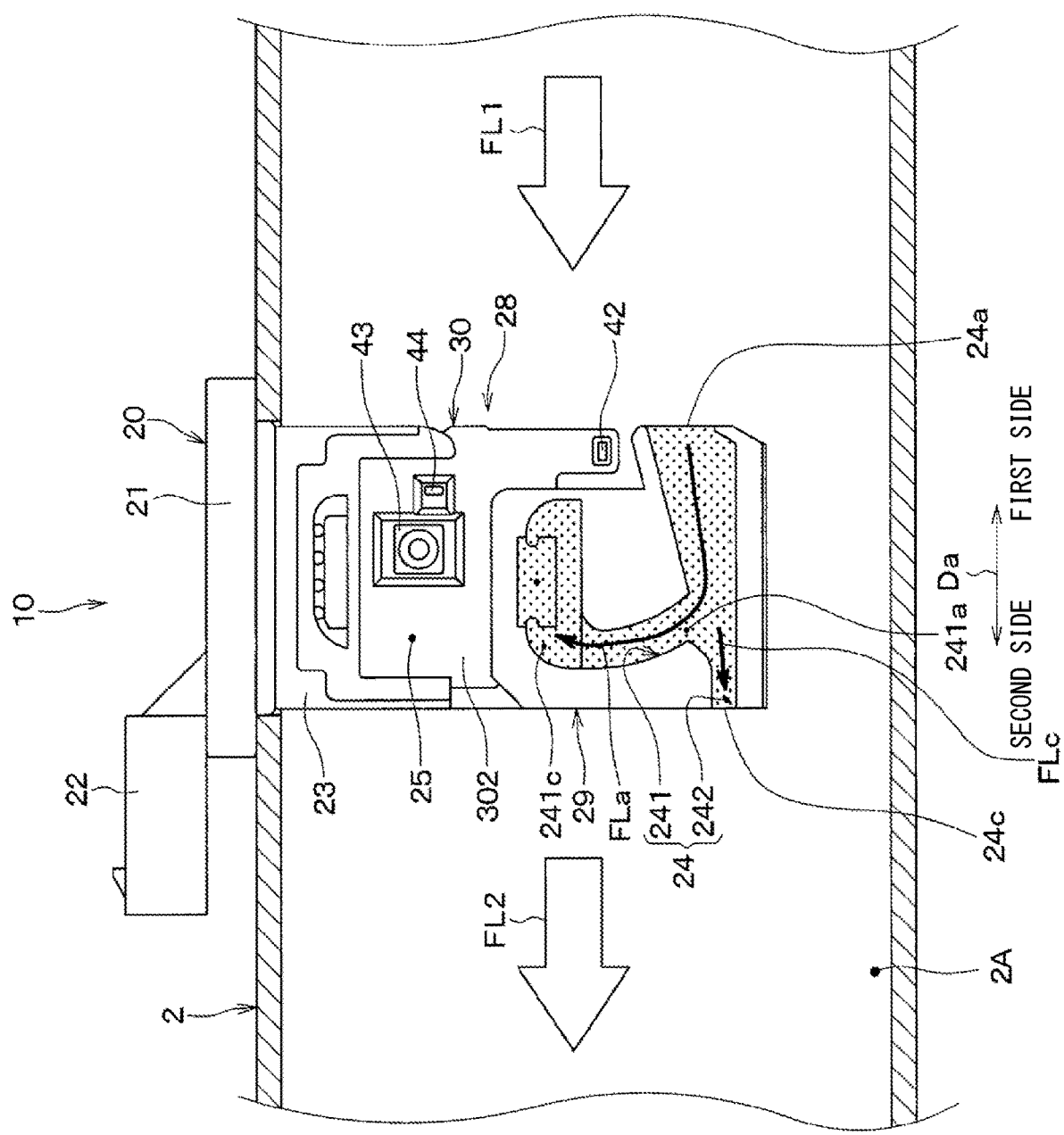
FIG. 3 is a schematic view of the physical quantity detector in the first embodiment in which a second cover is virtually removed and the cross section of the intake pipe, the schematic view being viewed in a direction same as the direction in FIG. 1.
Figure 4:
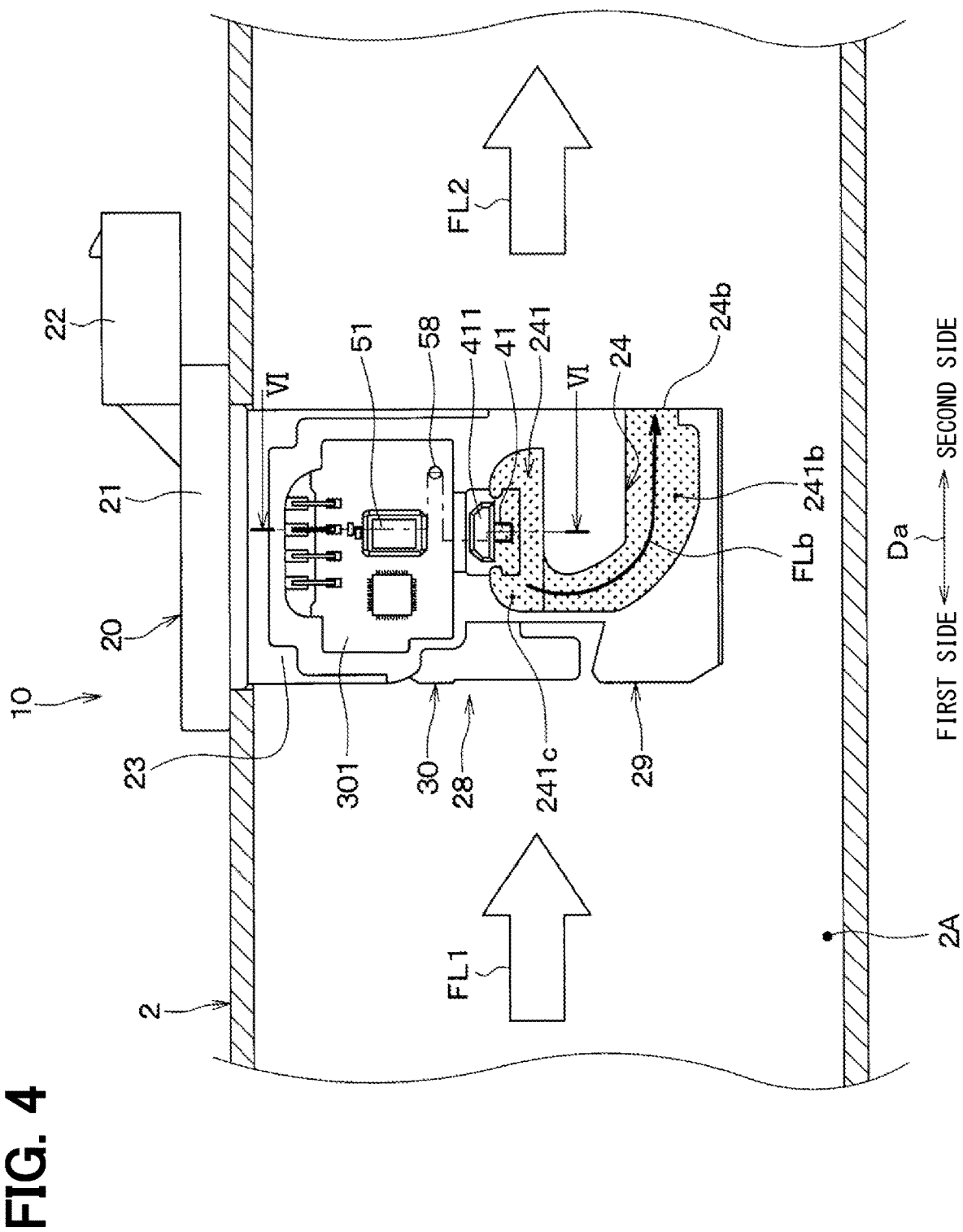
FIG. 4 is a schematic view of the physical quantity detector in the first embodiment in which a first cover, a conductor, and a covering resin member are virtually removed and the cross section of the intake pipe, the schematic view being viewed in the same direction as the direction in FIG. 2.

As shown in FIGS. 1 to 4, the physical quantity detector 10 includes a housing 20, a first cover 26, a second cover 27, a circuit board assembly 28, a covering resin 54 (see FIG. 6), a conductor 56 (see FIG. 6), and a conductive member 58. The housing 20, the first cover 26, and the second cover 27 constitute a case serving as an outer frame of the physical quantity detector 10. In FIG. 4, an illustration of the covering resin 54 is omitted for descriptive purposes.

The circuit board assembly 28 includes a circuit board 30 and multiple mounting components mounted on the circuit board 30. Specifically, the circuit board assembly 28 includes the circuit board 30, a flow rate detecting element 41, an element protector 411 for the flow rate detecting element 41, a temperature detecting element 42, a pressure detecting element 43, a humidity detecting element 44, and a large scale integration (i.e., LSI) 51. In this embodiment, the flow rate detecting element 41, the temperature detecting element 42, the pressure detecting element 43, and the humidity detecting element 44 as a whole are sometimes referred to as detecting elements 41 to 44.

As shown in FIGS. 1 to 4, the housing 20 of the physical quantity detector 10 includes a flange 21 configured to fix the physical quantity detector 10 to the intake pipe 2, an external connector 22 protruding outward from the flange 21, and a housing body 23.

The intake pipe 2 defines an attachment hole and the flange 21 is inserted into the attachment hole to be joined to the intake pipe 2.

The external connector 22 of the housing 20 electrically connects the physical quantity detector 10 to an external device. The external connector 22 is disposed on an upper surface of the flange 21 and protrudes from the flange 21 toward the downstream side in the flow direction of the target fluid. Arrows FL1 and FL2 in FIGS. 1 to 4 indicate the flow direction of the target fluid in the main passage 2A.

The external connector 22 electrically connects the physical quantity detector 10 to a controller (not shown) of the control system for the internal combustion engine. The external connector 22 houses connecting terminals 221 (see FIG. 5). The physical quantity detector 10 transmits information on measurement results to an external member through the connecting terminals 221. In addition, an electricity for operating the physical quantity detector 10 is supplied through the connecting terminals in the external connector 22. The external connector 22 is not limited to protrude toward the downstream side in the flow of the target fluid and may be protrude toward the upstream side or an upward.

The housing body 23 is disposed in the main passage 2A and protrudes from the flange 21 toward a center of the main passage 2A. In other words, the housing body 23 has a base end connected to the flange 21 and extends into the main passage 2A from the flange 21 in a radial direction of the intake pipe 2.

Figure 5:
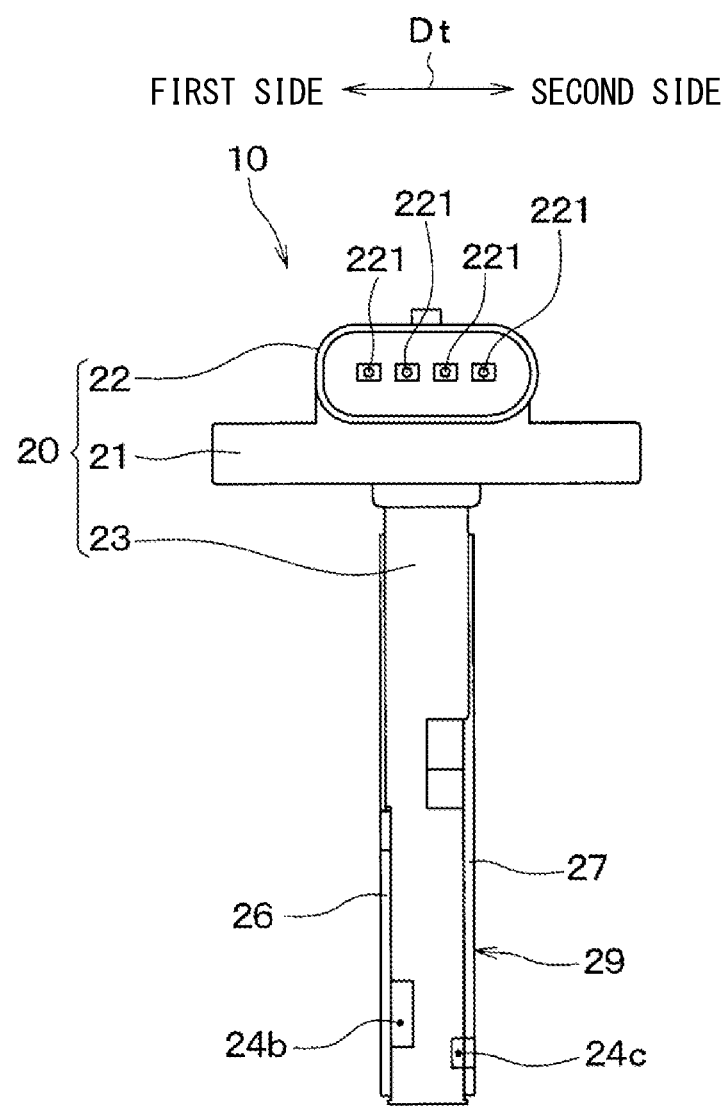
FIG. 5 is a schematic view of the physical quantity detector viewed in a direction of an arrow V in FIG. 1.

As shown in FIGS. 1, 2, and 5, the first cover 26 and the second cover 27 are integrally fixed to the housing body 23. As a result, the first cover 26 and the second cover 27 are disposed in the main passage together with the housing body 23. The housing body 23, the first cover 26, and the second cover 27 as a whole constitute a main passage side portion 29 disposed in the main passage 2A.

The main passage side portion 29 has a substantial plate shape having a certain degree of thickness and extends in the main passage 2A in the flow direction of the target fluid (i.e., the extending direction Da). A thickness direction of the main passage side portion 29 is the same as a thickness direction of the circuit board 30 of the circuit board assembly 28 and perpendicular to the extending direction Da.

In this embodiment, the thickness direction of the circuit board 30 is referred to as a thickness direction Dt. In FIGS.

1 to 4, the thickness direction Dt coincides with a vertical direction to a surface of paper. A first side and a second side of the physical quantity detector 10 is also defined in the thickness direction Dt. In FIG. 5, a left side is the first side in the thickness direction Dt and a right side is the second side in the thickness direction Dt.

Figure 6:
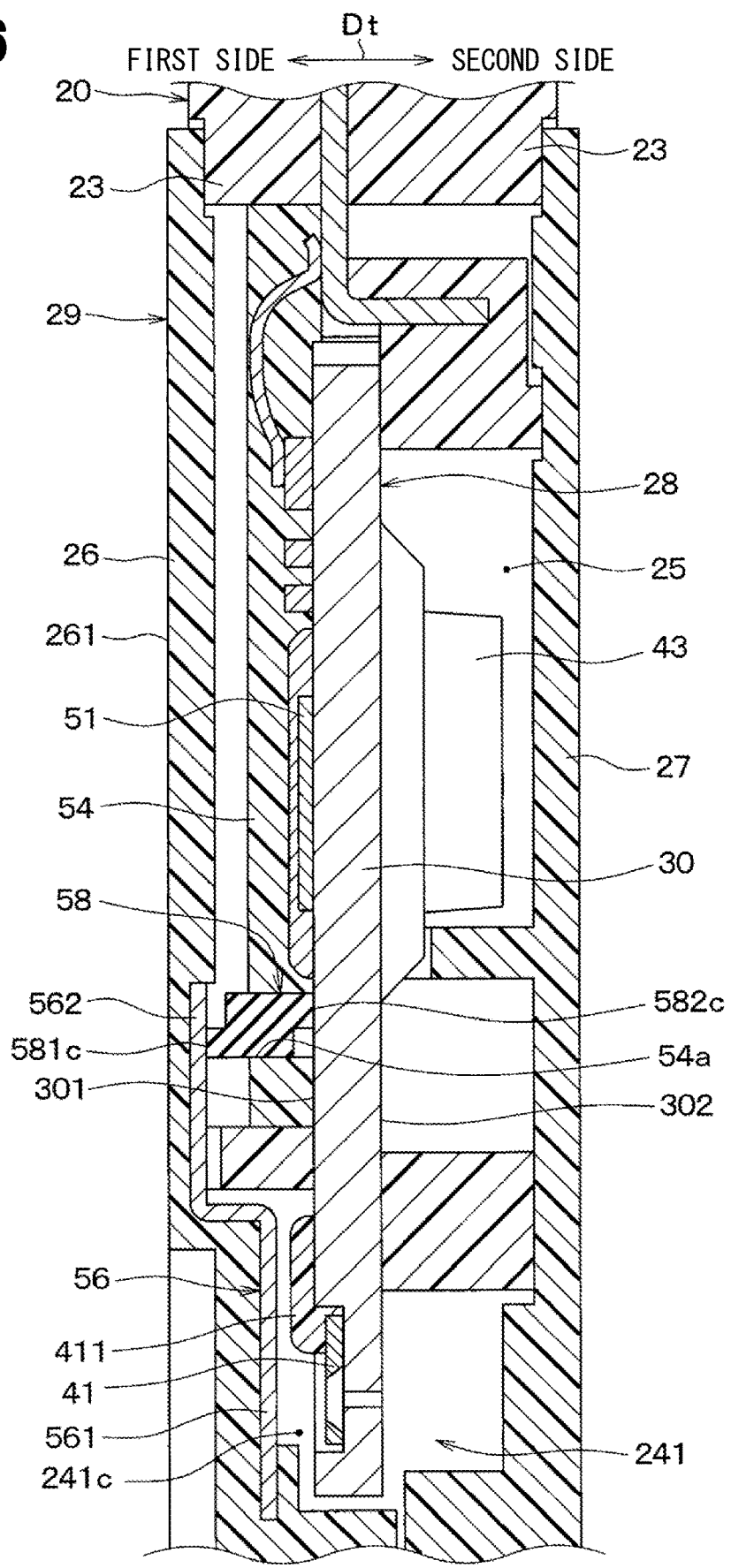
FIG. 6 is a cross-sectional view taken along a line VI-VI in FIG. 2 in the first embodiment and illustrating an inner structure of a main passage side portion.

As shown in FIGS. 1 to 4, the main passage side portion 29 defines a sub passage 24 through which the target fluid flows and the circuit board assembly 28 is installed in the main passage side portion 29. Specifically, as shown in FIGS. 1, 2, and 6, the first cover 26 is disposed in the first side of the circuit board 30 in the thickness direction Dt. The second cover 27 is disposed in the second side of the circuit board 30 in the thickness direction Dt. Each of the first cover 26 and the second cover 27 may be made of a resin and has a substantial plate shape having a thickness in the thickness direction Dt.

The housing 20 including the housing body 23 is made of, for example, a resin and molded by insert molding with the circuit board assembly 28 as an insert. The first cover 26 is disposed to cover the first side of the housing body 23 of the housing 20 in the thickness direction Dt and joined to the housing body 23 by, for example, welding. The second cover 27 is disposed to cover the second side of the housing body 23 in the thickness direction Dt and joined to the housing body 23 by, for example, welding.

As described above, the first cover 26 defines a portion of the sub passage 24, together with the housing body 23 of the housing 20, between the first cover 26 and the housing body 23. The second cover 27 defines a portion of the sub passage 24, together with the housing body 23 of the housing 20, between the second cover 27 and the housing body 23. As shown in FIGS. 3 and 4, a part of the target fluid flowing through the main passage 2A flows through the sub passage 24. In FIGS. 3 and 4, the sub passage 24 is illustrated by hatching of a dot pattern. FIG. 6 is a cross-sectional view taken along a line VI-VI in FIG. 2 and also a cross-sectional view taken along a line VI-VI in FIG. 4.

As shown in FIGS. 3 and 4, the main passage side portion 29 defines a sub passage inlet 24a, a sub passage outlet 24b, and a discharge port 24c. A part of the target fluid flows into the sub passage 24 through the sub passage inlet 24a and returns to the main passage 2A through the sub passage outlet 24b. The sub passage inlet 24a, the sub passage outlet 24b, and the discharge port 24c are defined in a portion of the main passage side portion 29 closer to a tip end of the main passage side portion 29.

The sub passage inlet 24a opens to the first side of the housing 20 in the extending direction Da (i.e., the upstream side of the housing 20 in the flow direction of the target fluid). The sub passage outlet 24b and the discharge port 24c open to the second side of the housing 20 in the extending direction Da (i.e., the downstream side of the housing 20 in the flow direction of the target fluid).

The sub passage 24 includes a sub main passage 241 through which the target fluid introduced into the sub passage 24 through the sub passage inlet 24a flows and a sub branched passage 242 that is branched from the sub main passage 241. A part of the target fluid flowing through the sub main passage 241 flows into the sub branched passage 242.

The sub main passage 241 includes an upstream passage 241a, a downstream passage 241b, and a connecting passage 241c fluidly connecting the upstream passage 241a to the downstream passage 241b. The upstream passage 241a is defined in a portion of the main passage side portion 29 closer to the second side in the thickness direction Dt, so that the second cover 27 faces the upstream passage 241a. The downstream passage 241b is defined in a portion of the main passage side portion 29 closer to the first side in the thickness direction Dt, so that the first cover 26 faces the downstream passage 241b.

The upstream passage 241a extends from the sub passage inlet 24a toward a downstream side in the flow direction of the target fluid and the sub branched passage 242 is branched from a middle of the upstream passage 241a. The upstream passage 241a curves toward the flange 21 as extending from the branched portion with the sub branched passage 242 to a downstream side in the flow direction of the target fluid. The upstream passage 241a has a downstream end that is fluidly connected to the connecting passage 241c. The target fluid flowing into the upstream passage 241a through the sub passage inlet 24a flows through the upstream passage 241a as shown in an arrow FLa.

The connecting passage 241c is a passage passing through the housing body 23 in the thickness direction Dt. The connecting passage 241c houses a part of the circuit board 30 on which the flow rate detecting element 41 is mounted. Thus, the flow rate detecting element 41 is disposed in the sub passage 24, specifically in the connecting passage 241c of the sub passage 24. The flow rate detecting element 41 is configured to detect a flow rate of the target fluid (i.e., one of physical quantities of the target fluid) and transmit detecting signals indicating the flow rate. The flow rate detecting element 41 is not limited to a specified type, but may be configured as a thermal type flow rate detector.

The downstream passage 241b extends from the sub passage outlet 24b toward an upstream side in the flow direction of the target fluid. The downstream passage 241b curves toward the flange 21 as extending toward the upstream side. The downstream passage 24b has an upstream end that is fluidly connected to the connecting passage 241c. The target fluid flowing into the downstream passage 241b from the connecting passage 241c flows through the downstream passage 241b toward the sub passage outlet 24b as shown in an arrow FLb.

The sub main passage 241 is configured such that the upstream passage 241a, the connecting passage 241c, and the downstream passage 241b are disposed in this order from the upstream side of the sub main passage 241 in the flow direction of the target fluid. Thus, the target fluid flowing into the sub main passage 241 through the sub passage inlet 24a substantially rotates once as shown in the arrows FLa and FLb and flows out of the physical quantity detector 10 through the sub passage outlet 24b.

The sub branched passage 242 is a passage fluidly connecting the branched portion with the sub main passage 241 to the discharge port 24c. The sub branched passage 242 extends straight from the branched portion with the sub main passage 241 toward the discharge port 24c in the flow direction of the target fluid. Foreign matters with a large mass flowing into the sub passage 24 through the sub passage inlet 24a, such as water, dust, oil, and the like, flows out of the physical quantity detector 10 through the sub branched passage 242 and the discharge port 24c.

As shown in FIG. 3, the main passage side portion 29 defines an open space 25. The open space 25 opens to both the first side and the second side in the extending direction Da, thus a part of the fluid flowing through the main passage 2A flows through the open space 25. The target fluid flows between the open space 25 and the main passage 2A through holes partially disposed in the first cover 26 and the second cover 27 (see FIGS. 1 and 2). The open space 25 is separated from the sub passage 24 with the housing body 23.

The temperature detecting element 42, the pressure detecting element 43, and the humidity detecting element 44 mounted on the circuit board 30 are housed in the open space 25.

The temperature detecting element 42 is configured to detect a temperature of the target fluid that is one of the physical quantities of the target fluid and transmit detecting signals indicating the temperature. The pressure detecting element 43 is configured to detect a pressure of the target fluid that is one of the physical quantities of the target fluid and transmit detecting signals indicating the pressure. The humidity detecting element 44 is configured to detect a relative humidity of the target fluid that is one of the physical quantities of the target fluid and transmit detecting signals indicating the relative humidity.

As shown in FIGS. 3, 4, and 6, the circuit board 30 has a flat plate shape and includes a first board surface 301 facing the first cover 26 in the thickness direction Dt and a second board surface 302 facing the second cover 27 in the thickness direction Dt. That is, the second board surface 302 is an opposite surface to the first board surface 301. The first board surface 301 and the second board surface 302 are formed as board surfaces of the circuit board 30.

The circuit board 30 is, for example, a glass epoxy circuit board using a glass epoxy material as a base material and both the first board surface 301 and the second board surface 302 include wiring patterns constituting electric circuits. The circuit board 30 and mounting elements mounted on the circuit board 30 are housed in the housing body 23.

The LSI 51 and the flow rate detecting element 41 are mounted on the first board surface 301 of the circuit board 30. The LSI 51 is an electronic element configuring a control circuit, for example, executing signal processing of the detecting signals transmitted from the detecting elements 41 to 44.

The second board surface 302 of the circuit board 30 faces the open space 25. The temperature detecting element 42, the pressure detecting element 43, and the humidity detecting element 44 are mounted on the second board surface 302.

The flow rate detecting element 41 is disposed on the first board surface 301 of the circuit board 30 and connected to the wiring pattern of the circuit board 30 with, for example, wire bonding. A connection formed by the wire bonding is covered with and protected by the element protector 411 formed by a solidified potting resin. The element protector 411 rises from the first board surface 301 of the circuit board 30.

The housing body 23 is molded by insert molding using the circuit board assembly 28 as an insert, thus a part of the circuit board 30 is fixed to the housing body 23.

As shown in FIG. 6, the covering resin 54 protects, against corrosion, electronic components such as the LSI 51 mounted on the first board surface 301 of the circuit board 30 and electric connecting portions between the electronic components and the circuit board 30. Specifically, the covering resin 54 is disposed between the first cover 26 and the circuit board 30 and covers the first board surface 301 and the electronic components such as the LSI 51. For example, the covering resin 54 covers the LSI disposed on the first board surface 301 and the electric connecting portion between the LSI 51 and the circuit board 30. The covering resin 54 does not extend to the flow rate detecting element 41 not to cover the flow rate detecting element 41.

The covering resin 54 has a flat plate shape along the circuit board 30. The covering resin 54 is in close contact with the first board surface 301.

It is preferable that the covering resin 54 has an electrical insulation property. The covering resin 54 is made of, for example, a thermosetting resin such as an epoxy resin and a polyurethane resin and a thermoplastic resin such as a polyimide resin and an acrylic resin.

The conductor 56 prevents foreign matters such as dusts in the target fluid from being charged and from adhering to the flow rate detecting element 41 and a vicinity of the flow rate detecting element 41. The conductor 56 may be made of a resin material including conductive fillers such as carbon while having a conductivity. In this embodiment, the conductor 56 is formed with a metal plate having a conductivity such as an aluminum alloy.

The conductor 56 is integrally fixed to the first cover 26. A fixing method for which the conductor 56 is fixed to the first cover 26 is not limited to a specified way, but in this embodiment, the first cover 26 is formed by insert molding using the conductor 56 as an insert and the conductor 56 is fixed to the first cover 26 by insert molding.

As shown in FIGS. 4 and 6, the conductor 56 includes a passage side portion 561 disposed in the sub passage 24 and a connecting portion 562 disposed in the first side of the circuit board 30 in the thickness direction Dt. Both the passage side portion 561 and the flow rate detecting element 41 are disposed in the connecting passage 241c of the sub passage 24. A thickness direction of the conductor 56 formed by the metal plate is the same as the thickness direction Dt in both the passage side portion 561 and the connecting portion 562.

The passage side portion 561 of the conductor 56 is exposed to the target fluid in the connecting passage 241c and disposed in the first side of the flow rate detecting element 41 in the thickness direction Dt with a distance between the conductor 56 and the flow rate detecting element 41. The passage side portion 561 faces and overlaps with the flow rate detecting element 41 in the thickness direction Dt.

The connecting portion 562 of the conductor 56 has a first surface in the thickness direction Dt that is covered with the first cover 26 and in close contact with the first cover 26. Thereby, the first cover 26 restricts the connecting portion 562 of the conductor 56 from bending toward the first side in the thickness direction Dt. The connecting portion 562 of the conductor 56 has a second surface in the thickness direction Dt that is not in contact with the first cover 26 and faces the first board surface 301 in the thickness direction Dt.

Figure 7:
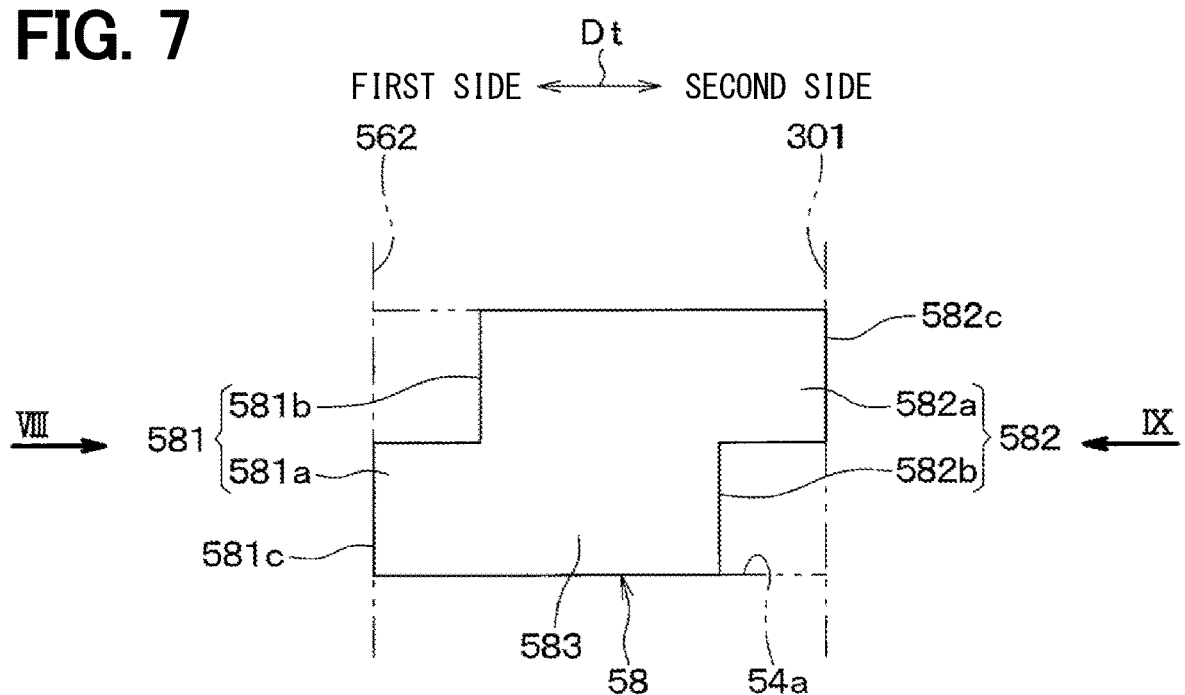
FIG. 7 is a front view of a conductive member in the first embodiment viewed in a direction same as the direction in FIG. 6.

As shown in FIGS. 4, 6, and 7, the conductive member 58 has a substantial cylindrical pillar shape having an axial direction in the thickness direction Dt. The conductive member 58 is disposed between the connecting portion 562 of the conductor 56 and the circuit board 30 in the thickness direction Dt. The conductive member 58 is inserted and fit into the covering resin 54 disposed on the first board surface 301. In detail, the covering resin 54 defines a resin through hole 54a that is a through hole and the conductive member 58 is inserted into the resin through hole 54a. FIG. 7 is a schematic view illustrating the conductive member 58 alone but a peripheral configuration of the conductive member 58 is roughly illustrated in FIG. 7 by a chain double-dashed line for descriptive purposes.

The conductive member 58 is disposed between the connecting portion 562 of the conductor 56 and the circuit board 30 and in contact with both the connecting portion 562 and the circuit board 30. In other words, the conductive member 58 is in contact with both the connecting portion 562 and the circuit board 30 while being sandwiched between the connecting portion 562 and the circuit board 30. The conductive member 58 electrically connects the connecting portion 562 to the circuit board 30 with this contact. In detail, the conductive member 58 electrically connects the connecting portion 562 to the circuit board 30 while being compressed between the connecting portion 562 of the conductor 56 and the circuit board 30 in the thickness direction Dt. That is, the conductive member 58 is in pressure contact with both the connecting portion 562 and the circuit board 30. In this embodiment, each of the connecting portion 562 and the first board surface 301 corresponds to a contact target of the conductive member 58.

The conductive member 58 is made of, for example, a conductive resin having an elasticity and a conductivity to obtain the electric connecting through the conductive member 58 as described above. The conductive resin has a rubber like property and includes conductive fillers such as carbon.

For example, in this embodiment, the first cover 26 is fixed to the housing body 23 in a manufacturing process of the physical quantity detector 10 and the conductive member 58 is compressed between the connecting portion 562 of the conductor 56 and the circuit board 30 in the thickness direction Dt.

Specifically, as shown in FIG. 6, the conductive member 58 is in contact with the first board surface 301 and then the first cover 26 to which the conductor 56 is integrally fixed is attached to the housing body 23. A free length of the conductive member 58 in the thickness direction Dt is slightly longer than a distance between the first board surface 301 and the connecting portion 562 of the conductor 56 in the thickness direction Dt. Thus, the conductive member 58 is compressed between the connecting portion 562 of the conductor 56 and the circuit board 30 in the thickness direction Dt.

Thereby, the conductive member 58 is compressed in the thickness direction Dt as described above and the conductor 56 is electrically connected to the ground circuit of the circuit board 30 through the conductive member 58. This electrical connection allows static elimination at the passage side portion 561 of the conductor 56, e.g., a peripheral portion of the flow rate detecting element 41.

As shown in FIGS. 6 through 9, the conductive member 58 includes a first end 581 disposed to face the connecting portion 562 in the thickness direction Dt and a second end 582 disposed to face the first board surface 301 in the thickness direction Dt.

The first end 581 includes a contact portion 581a that is in contact with the connecting portion 562 as the contact target and a contactless portion 581b that is distanced away from the connecting portion 562 in the thickness direction Dt. That is, the first end 581 of the conductive member 58 is not entirely in contact with the connecting portion 562 and a part of the first end 581 is in contact with the connecting portion 562. The covering resin 54 does not extend between the contactless portion 581b and the connecting portion 562 of the conductor 56 in the thickness direction Dt. That is, a space is defined in the thickness direction Dt between the contactless portion 581b and the connecting portion 562.

For example, the contact portion 581a protrudes relative to the contactless portion 581b in the thickness direction Dt. The contact portion 581a and the contactless portion 581b have semicircular shapes that are symmetrical with each other when viewed in the thickness direction Dt. Thus, a first contact surface 581c that is a contact surface of the conductive member 58 with the connecting portion 562 of the conductor 56 has a semicircular shape or substantially semicircular shape.

Figure 9:
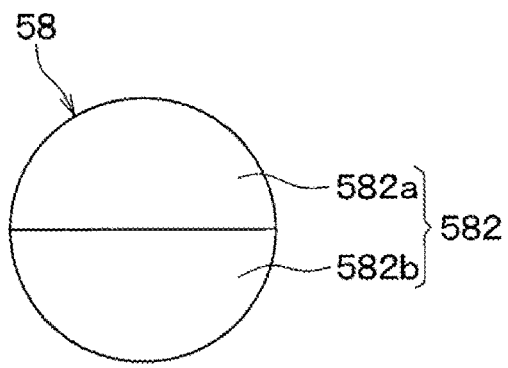
FIG. 9 is a schematic view of a second end of the conductive member viewed in a direction of an arrow IX in FIG. 7.

As shown in FIG. 7, the second end 582 of the conductive member 58 has a shape that is point symmetry with the first end 581. Specifically, as shown in FIGS. 7 and 9, the second end 582 includes a second contact portion 582a that is in contact with the first board surface 301 as the contact target and a second contactless portion 582b that is distanced away from the first board surface 301 in the thickness direction Dt. The second end 582 of the conductive member 58 is not entirely in contact with the first board surface 301 and a part of the second end 582 is in contact with the first board surface 301. The covering resin 54 does not extend between the second contactless portion 582b and the first board surface 301 in the thickness direction Dt. That is, a space is defined in the thickness direction Dt between the second contactless portion 582b and the first board surface 301.

For example, the second contact portion 582a protrudes toward the second side in the thickness direction Dt relative to the second contactless portion 582b. The second contact portion 582a and the second contactless portion 582b have shapes that are symmetrical with each other when viewed in the thickness direction Dt. Thus, a second contact surface 582c that is a contact surface of the conductive member 58 with the first board surface 301 has a semicircular shape or a substantial semicircular shape.

As shown in FIG. 7, the conductive member 58 includes a thickest portion 583 that has a maximum cross-sectional area in the conductive member 58 that is taken along a line perpendicular to the thickness direction Dt. The thickest portion 583 is disposed between the first end 581 and the second end 582.

Specifically, each of the first end 581 and the second end 582 includes a cross section in the conductive member 58 that is taken along a line perpendicular to the thickness direction Dt. The cross section has a semicircular shape and the cross section of the thickest portion 583 has a circular shape. An outer diameter of the thickest portion 583 is a maximum outer diameter of the conductive member 58. Thus, a contact area in which the first contact portion 581a is in contact with the connecting portion 562 of the conductor 56, i.e., an area of the first contact surface 581c is smaller than the maximum cross-sectional area of the thickest portion 583. A contact area in which the second contact portion 582a is in contact with the first board surface 301, i.e., an area of the second contact surface 582c is smaller than the maximum cross-sectional area of the thickest portion 583.

As shown in FIGS. 6 through 9, as described above in this embodiment, the first end 581 of the conductive member 58 includes the first contact portion 581a that is in contact with the connecting portion 562 of the conductor 56 and the first contactless portion 581b that is distanced in the thickness direction Dt away from the connecting portion 562. The second end 582 of the conductive member 58 includes the second contact portion 582a that is in contact with the first board surface 301 and the second contactless portion 582b that is distanced in the thickness direction Dt away from the first board surface 301.

Thus, even if the conductive member 58 expands or contracts in response to a temperature change, the expansion and the contraction can be released at both ends 581 and 582 of the conductive member 58. A stress, along with the temperature change, applied from the conductive member 58 to the conductor 56 and the circuit board 30 can be relaxed. Therefore, a reliability of the electrical connection between the conductor 56 and the circuit board 30 through the conductive member 58 can be improved. In addition, the first cover 26 is restricted from being deformed when the temperature of the conductive member 58 is changed.

When the temperature of the conductive member 58 changes, a stress may be generated by the conductive member 58 pressing, in a radial direction of the conductive member 58, the covering resin 54 that covers the conductive member 58. The stress can be also reduced by the ends 581 and 582 of the conductive member 58. As a result, a characteristic change along with a deformation of the LSI 51 can be suppressed and a soldering between the circuit board 30 and the mounting components is restricted from cracking.

In this embodiment, the conductive member 58 includes the thickest portion 583 that has the maximum cross sectional area in the conductive member 58 that is taken along a line perpendicular to the thickness direction Dt. The area of the first contact surface 581c and the area of the second contact surface 582c are smaller than the maximum cross-sectional area of the thickest portion 583. Thus, each of the ends 581 and 582 is more deformable than the thickest portion 583 and a shape change in response to the temperature change of the conductive member 58 is likely to occur at the ends 581 and 582.

Second Embodiment

Next, a second embodiment will be described. In this embodiment, different portions from the first embodiment will be mainly described. Descriptions of the same portions and equivalent portions with the first embodiment are omitted or simplified. The same applies to descriptions of embodiments as described later.

Figure 10:
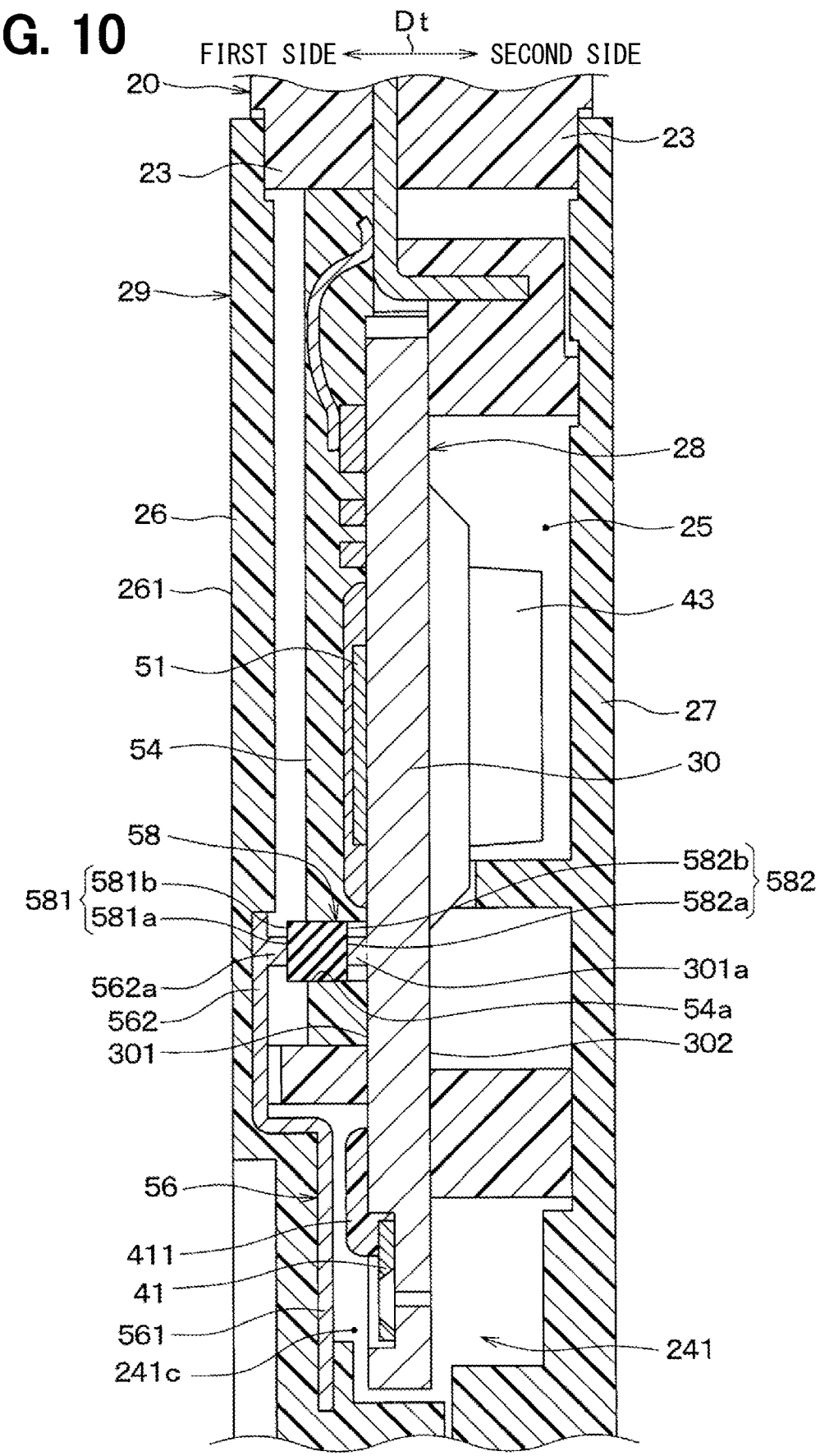
FIG. 10 is a cross-sectional view in a second embodiment corresponding to the cross-sectional view of FIG. 6 that is taken along the line VI-VI in FIG. 2.

As shown in FIG. 10, the conductive member 58 in this embodiment has a simple cylindrical pillar shape having an axial direction in the thickness direction Dt, which is different from the first embodiment. The connecting portion 562 of the conductor 56 includes a connecting protrusion 562a and the circuit board 30 includes a first board surface protrusion 301a on the first board surface 301. This embodiment is different from the first embodiment in these points.

Specifically, the connecting protrusion 562a of the connecting portion 562 of the conductor 56 is in contact with the first contact portion 581a of the conductive member 58. The connecting protrusion 562a protrudes toward the first contact portion 581a in the thickness direction Dt. For example, the connecting protrusion 562a protrudes toward the second side in the thickness direction Dt into a circular pillar shape. The connecting protrusion 562a has a diameter that is smaller than a diameter of the conductive member 58. Thus, the first contactless portion 581b of the conductive member 58 is distanced in the thickness direction Dt away from the connecting portion 562 of the conductor 56.

As described above, the first end 581 of the conductive member 58 can include both the first contact portion 581a and the first contactless portion 581b even if the first end 581 of the conductive member 58 is formed into a simple cylindrical pillar shape.

The first board surface protrusion 301a of the first board surface 301 is in contact with the second contact portion 582a of the conductive member 58. The first board surface protrusion 301a protrudes toward the second contact portion 582a in the thickness direction Dt. For example, the first board surface protrusion 301a protrudes toward the first side in the thickness direction Dt into a cylindrical pillar shape. The first board surface protrusion 301a has a diameter that is smaller than a diameter of the conductive member 58. Thus, the second contactless portion 582b of the conductive member 58 is distanced in the thickness direction Dt away from the first board surface 301.

Therefore, the second end 582 of the conductive member 58 can include both the second contact portion 582a and the second contactless portion 582b even if the second end 582 of the conductive member 58 is formed into a simple shape such as a cylindrical pillar shape.

Other portions in this embodiment are similar to those in the first embodiment. In this embodiment, advantages obtained from common configurations with the first embodiment can be obtained as with the first embodiment.

Third Embodiment

Next, a third embodiment will be described. In this embodiment, different portions from the first embodiment will be mainly described.

Figure 11:
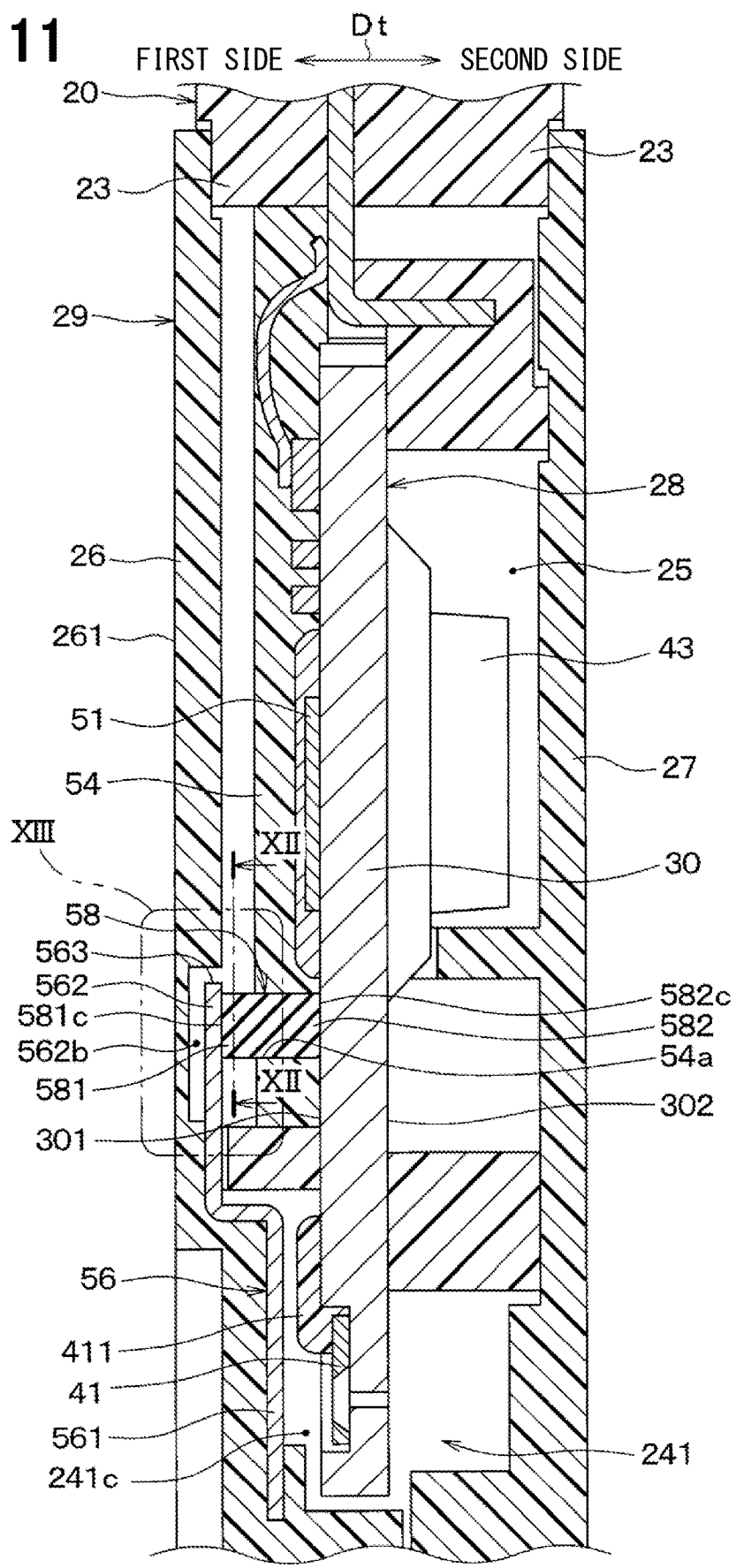
FIG. 11 is a cross-sectional view in a third embodiment corresponding to the cross-sectional view of FIG. 6 that is taken along the line VI-VI in FIG. 2.
Figure 12:
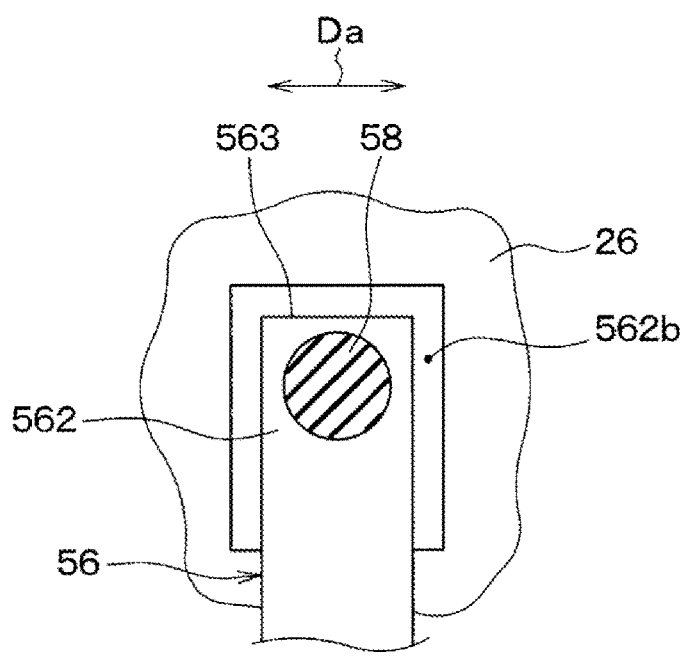
FIG. 12 is a cross-sectional view taken along a line XII-XII in FIG. 11.

As shown in FIGS. 11 and 12, the conductive member 58 in this embodiment has a simple cylindrical pillar shape having an axial direction along the thickness direction Dt. The third embodiment differs from the first embodiment at configurations of the first cover 26 around the connecting portion 562 of the conductor 56.

Specifically in this embodiment, since the first end 581 of the conductive member 58 is entirely in contact with the connecting portion 562 of the conductor 56, an entire portion of the first end 581 is a contact portion in contact with the connecting portion 562 and does not include the first contactless portion 581b (see FIG. 7). Similarly, since the second end 582 of the conductive member 58 is entirely in contact with the first board surface 301, an entire portion of the second end 582 is a contact portion in contact with the first board surface 301 and the second end 582 does not include the second contactless portion 582b (see FIG. 7).

The first cover 26 allows the connecting portion 562 of the conductor 56 to be bent in the thickness direction Dt away from the circuit board 30. That the connecting portion 562 of the conductor 56 is bent in the thickness direction Dt away from the circuit board 30 is, in other words, that the connecting portion 562 of the conductor 56 is bent toward the first cover 26 disposed in the first side of the connecting portion 562 in the thickness direction Dt. In short, the conductor 56 is bent as illustrated in a chain double-dashed line Lb in FIG. 13.

Figure 13:
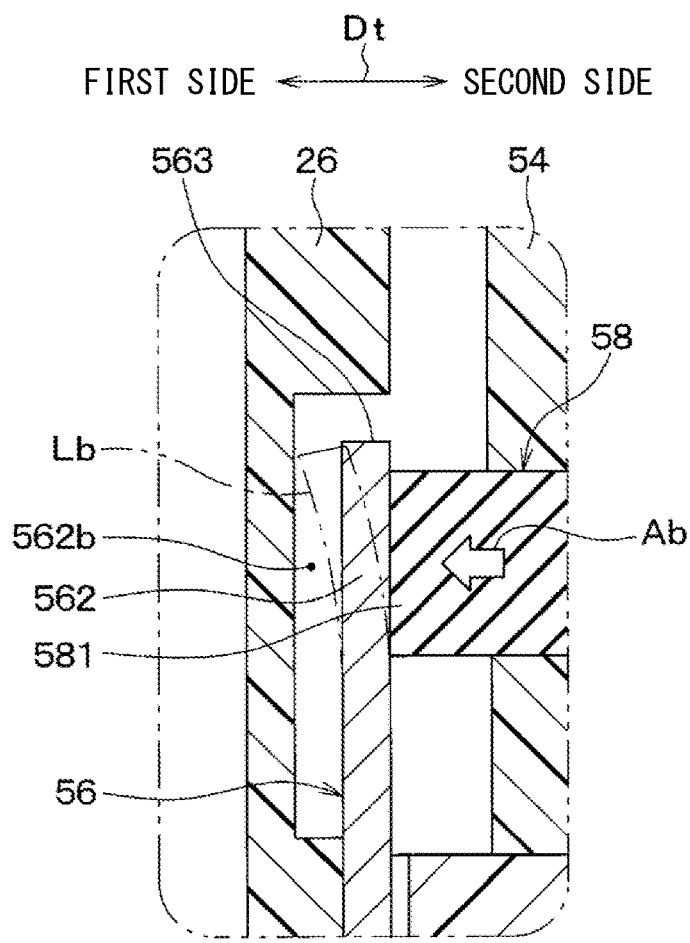
FIG. 13 is a partial enlarged view of a part XIII in FIG. 11 illustrating, with a chain double-dashed line, a state in which a conductor is bent according to a thermal expansion of a conductive member.

As shown in FIGS. 11 to 13 in this embodiment, the conductor 56 includes an end 563 that is located away from the passage side portion 561 and the connecting portion 562 of the conductor 56 includes the end 563. The connecting portion 562 of the conductor 56 is distanced away from the first cover 26 to define a connecting portion vicinity gap 562b between the connecting portion 562 and the first cover 26. Nothing is filled in the connecting portion vicinity gap 562b, that is, the connecting portion vicinity gap 562b is defined as a simple space. The connecting portion 562 of the conductor 56A has a thickness direction in the thickness direction Dt. When an external force is applied to the connecting portion 562 in the thickness direction Dt, the connecting portion 562 is bent in the thickness direction Dt with an elasticity.

As shown in FIG. 12, the connecting portion vicinity gap 562b expands beyond the connecting portion 562 of the conductor 56 when viewed in the thickness direction Dt. FIG. 12 is a cross-sectional view viewed in a direction from the first side to the second side in the thickness direction Dt.

As described above, as shown in FIGS. 11 through 13, the first cover 26 is configured to allow the connecting portion 562 of the conductor 56 to bend in the thickness direction Dt away from the circuit board 30. Thus, even when the conductive member 58 expands and contracts along with a temperature change, the expansion and the contraction can be released by bending the conductor 56. For example, when the conductive member 58 expands in the thickness direction Dt as shown in an arrow Ab in FIG. 13, the conductor 13 is bent as shown in the chain two-dashed line Lb in FIG. 13 along with the expansion. As a result, the expansion of the conductive member 58 can be absorbed.

Thus, a stress, along with the temperature change, applied to the conductor 56 and the circuit board 30 from the conductive member 58 can be relaxed. Therefore, the reliability of the electrical connection between the conductor 56 and the circuit board 30 through the conductive member 58 can be improved.

In this embodiment, the connecting portion 562 of the conductor 56 includes the end 563 of the conductor 56. The connecting portion 562 is distanced away from the first cover 26 to define the connecting portion vicinity gap 562b between the connecting portion 562 and the first cover 26. Thus, even when the connecting portion 562 of the conductor 56 is pressed by the conductive member 58 along with the thermal expansion, the first cover 26 is not pressed. Therefore, the first cover 26 is restricted from being deformed and a deterioration of an accuracy for detecting a flow rate is restricted.

As shown in FIG. 12, the connecting portion vicinity gap 562b expands beyond the connecting portion 562 of the conductor 56 when viewed in the thickness direction Dt in this embodiment. Thus, even if a small error occurs in an assembly between the first cover 26 and the conductor 56, the connecting portion 562 of the conductor 56 is restricted from interfering with the first cover 26 when the conductor 56 is bent. This leads to an improvement of the reliability of the electrical connection between the conductor 56 and the circuit board 30 through the conductive member 58.

Other portions in the third embodiment are similar to those in the first embodiment. In this embodiment, the same advantages obtained from the common configuration with the first embodiment can be obtained as with the first embodiment. The third embodiment is a modification of the first embodiment, but this embodiment can be combined with the second embodiment.

Fourth Embodiment

Next, a fourth embodiment will be described. This embodiment will be described mainly in points different from the third embodiment.

Figure 14:
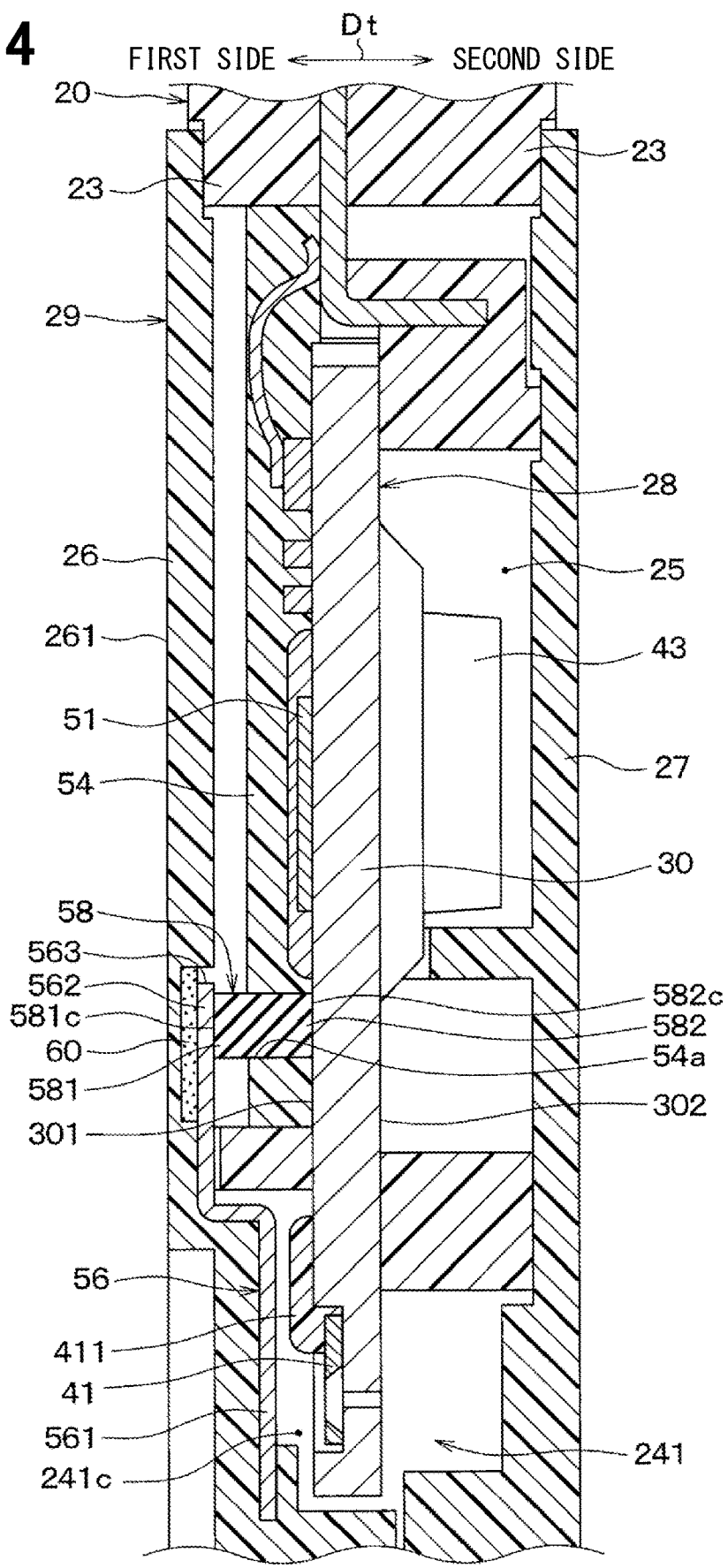
FIG. 14 is a cross-sectional view in a fourth embodiment corresponding to the cross-sectional view of FIG. 6 that is taken along the line VI-VI in FIG. 2.

As shown in FIG. 14, in this embodiment, the connecting portion 562 of the conductor 56 is distanced away from the first cover 26 as with the third embodiment. This embodiment is different from the third embodiment at a point that a flexible member 60 having an elastic modulus that is lower than an elastic modulus of the conductive member 58 is disposed between the connecting portion 562 and the first cover 26. In detail, the flexible member 60 is filled between the connecting portion 562 and the first cover 26. That the elastic modulus of the flexible member 60 is lower than that of the conductive member 58 means that the flexible member 60 is softer than the conductive member 58.

Specifically, in the physical quantity detector 10 in this embodiment, the flexible member 60 is filled in the connecting portion vicinity gap 562b in the third embodiment (see FIGS. 11 and 12). Thus, a shape of the flexible member 60 disposed between the connecting portion 562 of the conductor 56 and the first cover 26 is the same as a shape of the connecting portion vicinity gap 562b in the third embodiment.

Thereby, the first cover 26 is configured to allow the connecting portion 562 of the conductor 56 to be bent in the thickness direction Dt away from the circuit board 30 as with the third embodiment.

Aside from the above described aspects, the present embodiment is substantially the same with the third embodiment. The advantages obtained from the same configuration with the third embodiment can be obtained in this embodiment as with the third embodiment.

Fifth Embodiment

Next, a fifth embodiment will be described. This embodiment will be described mainly at portions different from the first embodiment described above.

Figure 15:
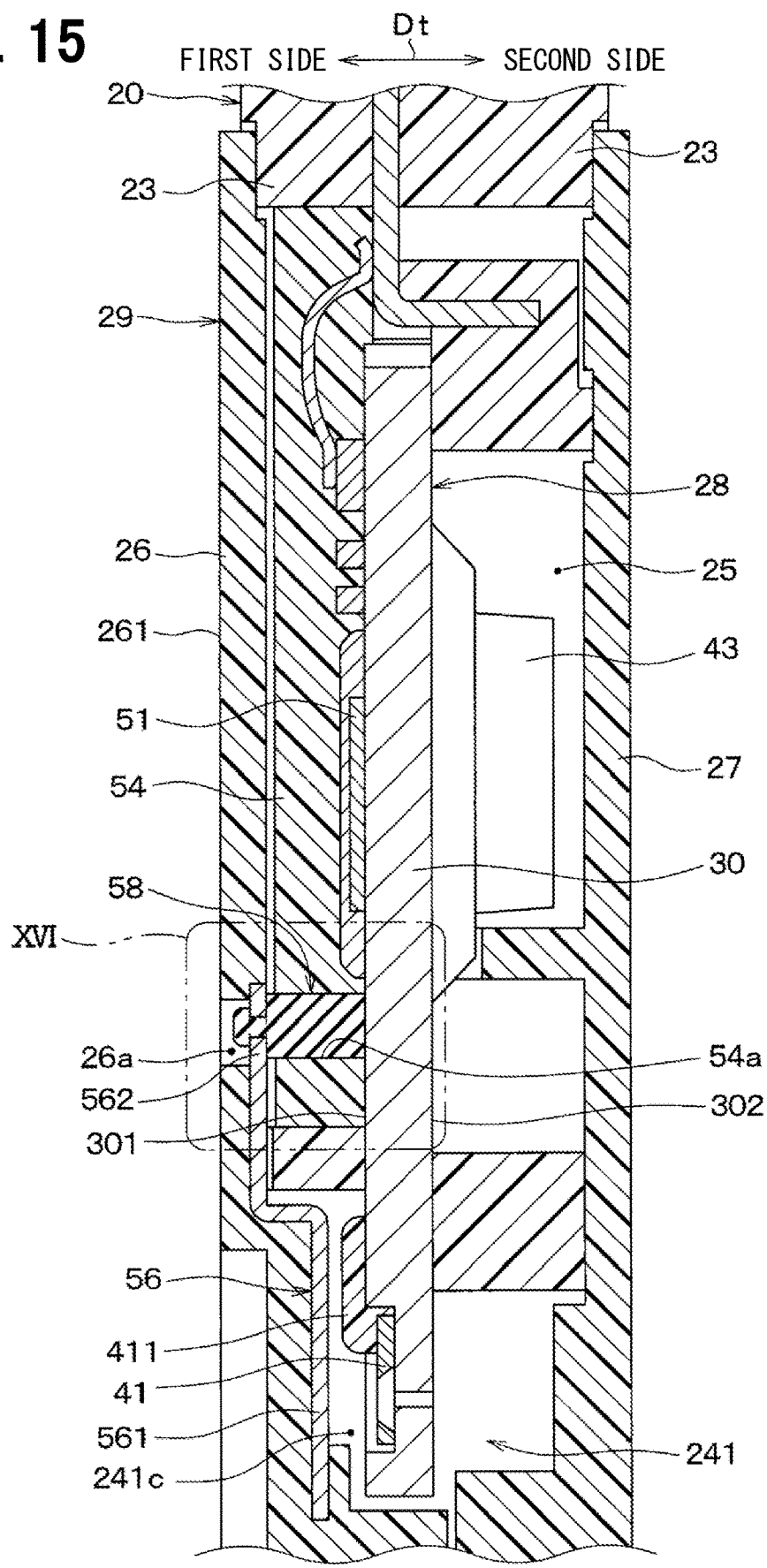
FIG. 15 is a cross-sectional view in a fifth embodiment corresponding to the cross-sectional view of FIG. 6 that is taken along the line VI-VI in FIG. 2.
Figure 16:
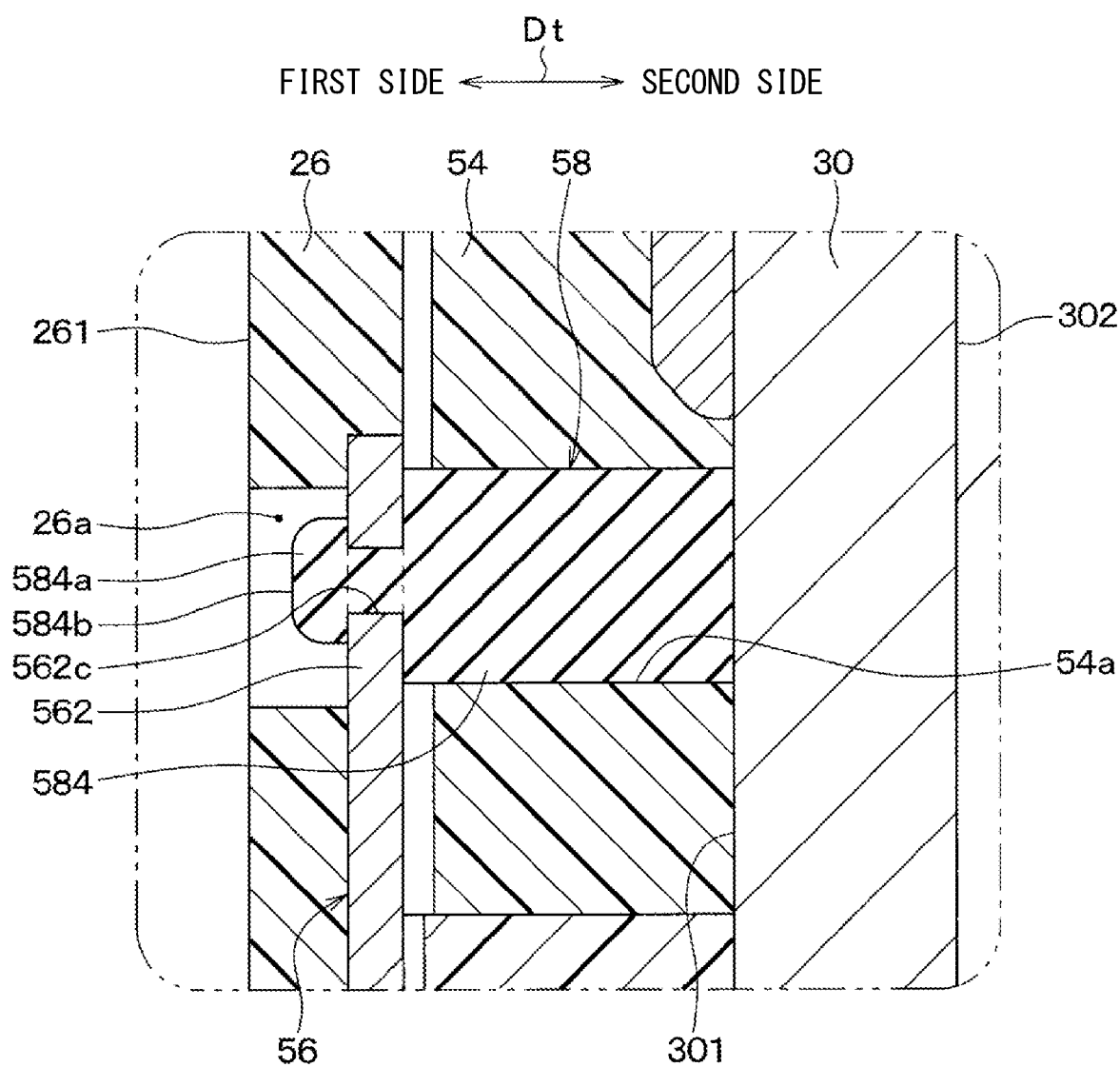
FIG. 16 is a partially enlarged view of a part XVI in FIG. 15.

As shown in FIGS. 15 and 16, this embodiment is different from the first embodiment at shapes of the conductive member 58, the connecting portion 562 of the conductor 56, and the first cover 26.

Specifically, the first cover 26 has an outer surface 261 disposed in the first side of the first cover 26 in the thickness direction Dt. The outer surface 261 defines a cover hole 26a passing through the first cover 26 in the thickness direction Dt.

The connecting portion 562 of the conductor 56 defines a connecting hole 562c passing through the connecting portion 562 in the thickness direction Dt. The connecting hole 562c is disposed inside the cover hole 26a when viewed in the thickness direction Dt.

The conductive member 58 includes a conductive solidified portion 584 that is joined to both the connecting portion 562 of the conductor 56 and the circuit board 30 by being solidified in a space between the connecting portion 562 and the circuit board 30. The conductive solidified portion 584 includes a conductivity.

The conductive solidified portion 584 fills in the resin through hole 54a and joined to both the first board surface 301 and the connecting portion 562 of the conductor 56. The conductive solidified portion 584 is inserted into the connecting hole 562c and protrudes from the first side of the connecting portion 562 in the thickness direction Dt. That is, the conductive solidified portion 584 includes a protrusion 584a protruding outward from the first side of the connecting portion 562 of the conductor 56 in the thickness direction Dt.

The protrusion 584a is disposed in the cover hole 26a and has a peak 584b at a first end of the protrusion 584a in the thickness direction Dt. The outer surface 261 of the first cover 26 is disposed in the first side of the peak 584b of the protrusion 584a in the thickness direction Dt.

Specifically, the conductive member 58 is constituted by only the conductive solidified portion 584 and the conductive solidified portion 584 is formed by solidifying a conducive adhesive having a conductivity.

In order to form the conductive solidified portion 584, for example, a conductive adhesive in liquid phase that is a material for the conductive solidified portion 584 is filled in the resin through hole 54a through the connecting hole 562c in a state where the conductor 56, the circuit board 30, and the covering resin 54 are arranged as shown in FIG. 16. The conductive adhesive in liquid phase is filled in the resin through hole 54a until the conductive adhesive overflows toward the first side of the connecting hole 562c in the thickness direction Dt. After filling the conductive adhesive, the conductive adhesive is solidified with natural drying or heating. In this way, the conductive solidified portion 584 is formed. The first cover 26 is slightly distanced in the thickness direction Dt by a gap away from the covering resin 54 in FIG. 16. The conductive adhesive in liquid phase has a certain degree of viscosity such that the conductive adhesive does not enter into the gap between the first cover 26 and the covering resin 54.

As described above, the conductive member 58 includes the conductive solidified portion 584 that is joined to both the connecting portion 562 of the conductor 56 and the circuit board 30 by being solidified. Thus, the conductive member 58 is accurately joined to both the conductor 56 and the circuit board 30 and the reliability of the electrical connection between the conductor 56 and the circuit board 30 through the conductive member 58 is thereby improved.

In this embodiment, the outer surface 261 of the first cover 26 is located in the first side of the peak 584b of the protrusion 584a of the conductive solidified portion 584. Thus, the protrusion 584a does not disturb a flow of the target fluid flowing through the main passage 2A along the outer surface 261 and an influence by the protrusion 584a on a measurement accuracy of the target fluid can be reduced.

In this embodiment, the conductive solidified portion 584 is formed by solidifying the conductive adhesive. Thus, it is easy to manufacture the physical quantity detector 10 including the conductive member 58.

Aside from the above described aspects, the present embodiment is substantially the same with the first embodiment. In this embodiment, the advantages obtained from the common configuration with the first embodiment can be obtained as with the first embodiment.

This embodiment is a modification of the first embodiment, but the present embodiment can be combined with the third embodiment.

Sixth Embodiment

Next, a sixth embodiment will be described. In this embodiment, different portions from the fifth embodiment will be mainly described.

Figure 17:
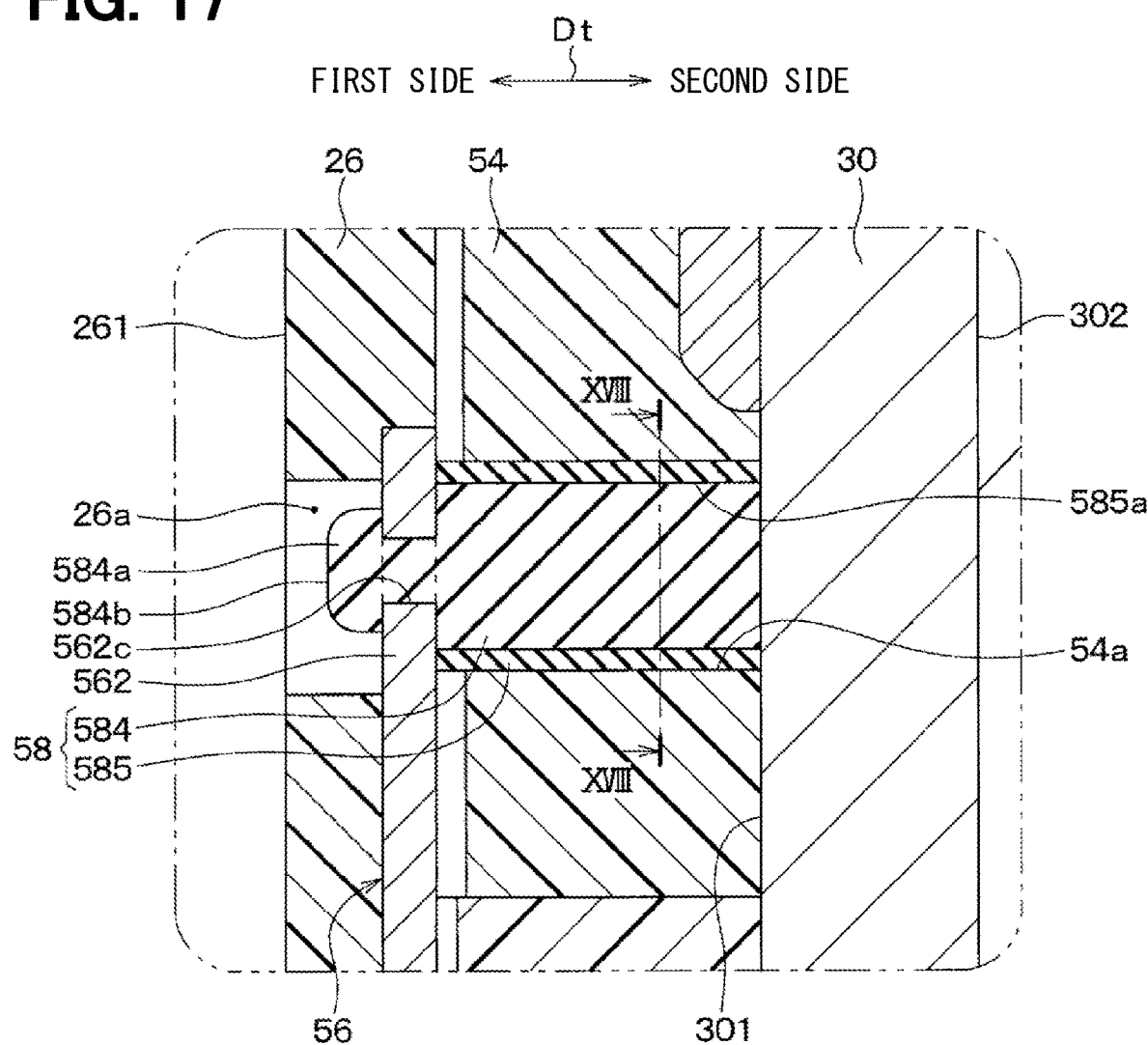
FIG. 17 is a partially enlarged view, corresponding to FIG. 16, of a part in a sixth embodiment corresponding to the part XVI in FIG. 15.
Figure 18:
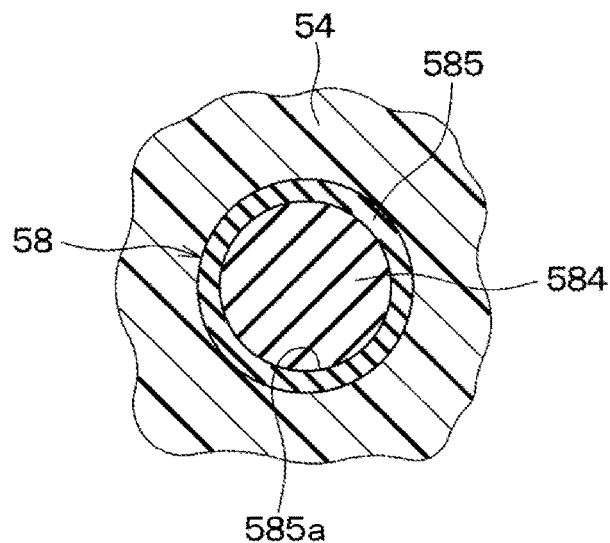
FIG. 18 is a cross-sectional view taken along a line XVIII-XVIII in FIG. 17.

As shown in FIGS. 17 and 18, the conductive member 58 includes a frame 585 in addition to the conductive solidified portion 584. This embodiment is different from the fifth embodiment in this point.

Specifically, the frame 585 of the conductive member 58 has a cylindrical hollow shape having an axial direction in the thickness direction Dt. Thus, the frame 585 defines a frame hole 585a passing through the frame 585 in the thickness direction Dt.

The frame 585 is inserted into the resin through hole 54a and extends from the first side to the second side of the covering resin 54. The frame 585 is disposed between the connecting portion 562 of the conductor 56 and the first board surface 301. The frame 585 has a first end that is in contact with the connecting portion 562 and a second end that is in contact with the first board surface 301.

In this embodiment, since the frame 585 is disposed, the conductive solidified portion 584 flows into the frame 585 and is joined to both the connecting portion 562 of the conductor 56 and the first board surface 301.

For example, following steps are performed to form the conductive solidified portion 584 in this embodiment. That is, the conductive adhesive in a liquid phase that is a material for the conductive solidified portion 584 is filled in the frame hole 585a through the connecting hole 562c in a state where the conductor 56, the circuit board 30, the covering resin 54, and the frame 585 are arranged as shown in FIG. 17. The manufacturing step of the conductive solidified portion 584 in following embodiments is similar to that in the fifth embodiment.

As described above, the frame 585 of the conductive member 58 is disposed between the connecting portion 562 of the conductor 56 and the first board surface 301 and in contact with the first board surface 301. The conductive solidified portion 584 is inserted into the frame hole 585a and in contact with both the connecting portion 562 of the conductor 56 and the first board surface 301. Thus, a material in liquid phase for the conductive solidified portion 584 is restricted from flowing into an undesired portion such as a gap between the first board surface 301 and the covering resin 54 in the manufacturing steps of the conductive solidified portion 584.

The frame 585 of the conductive member 58 does not necessarily have a conductivity while the frame 585 restricts the material in liquid phase from leaking from the frame hole 585a. The frame 585 may be made of a material that is softer than each of the covering resin 54 and the solidified portion 584 such as a soft rubber.

Aside from the above described aspects, the present embodiment is substantially the same with the fifth embodiment. In this embodiment, the same advantages obtained from the common configurations with the fifth embodiment can be obtained as with the fifth embodiment.

Seventh Embodiment

Next, a seventh embodiment will be described. This embodiment will be described mainly at points different from the sixth embodiment.

Figure 19:
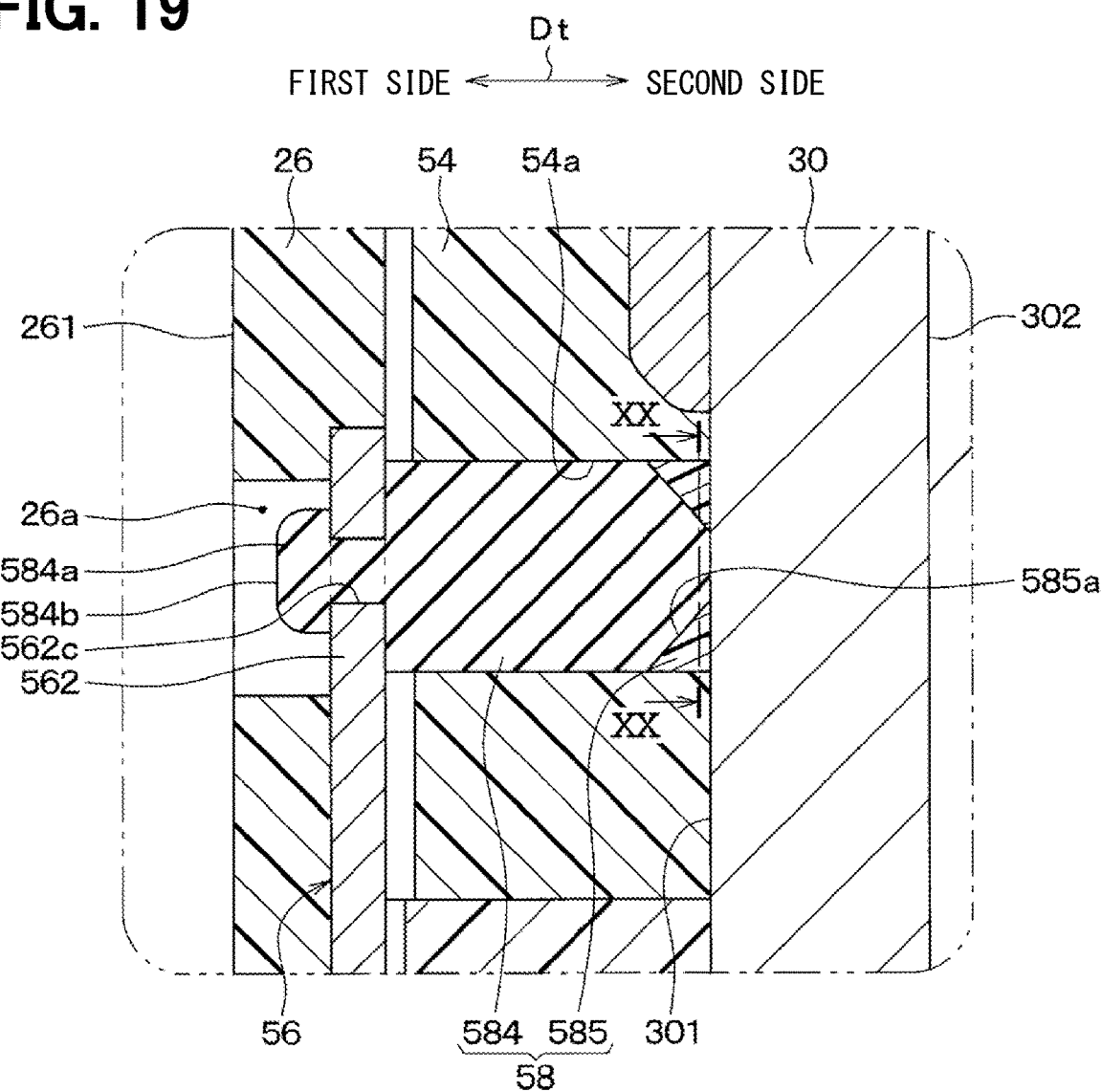
FIG. 19 is a partially enlarged view, corresponding to FIG. 16, of a part in a seventh embodiment corresponding to the part XVI in FIG. 15.
Figure 20:
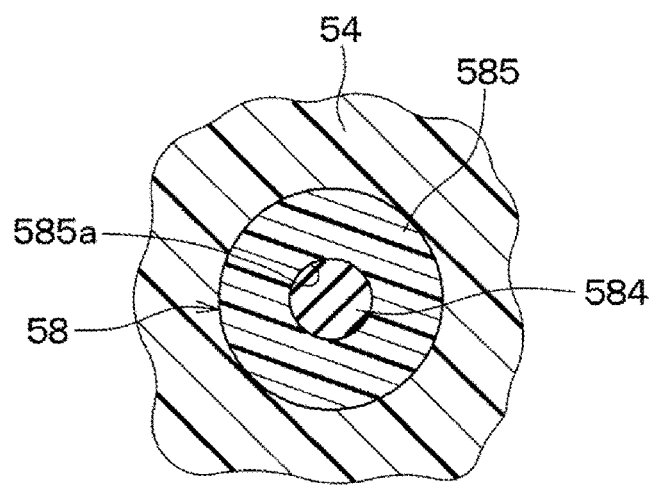
FIG. 20 is a cross-sectional view taken along a line XX-XX in FIG. 19.

As shown in FIGS. 19 and 20, this embodiment differs from the sixth embodiment at a shape of the frame 585 of the conductive member 58.

Specifically, the frame 585 of the conductive member 58 is disposed in the resin through hole 54a and disposed between the connecting portion 562 of the conductor 56 and the first board surface 301 as with the sixth embodiment. The conductive solidified portion 584 is inserted into the frame hole 585a of the frame 585 and joined to both the connecting portion 562 of the conductor 56 and the first board surface 301.

The present embodiment is different from the sixth embodiment at a point that the frame 585 in this embodiment is in contact with the first board surface 301 and is not in contact with the connecting portion 562 to be distanced away from the connecting portion 562 in the thickness direction Dt.

A material for the frame 585 in this embodiment may be a potting resin. In this case, the frame 585 is formed by applying the potting resin that is the material for the frame 585 on the first board surface 301 and solidifying the potting resin in the resin through hole 54a before the material in a liquid phase for the conductive solidified portion 584 is inserted into the resin through hole 54a.

Aside from the above described aspects, this embodiment is substantially the same with the sixth embodiment. In this embodiment, advantages obtained from the common configurations with the sixth embodiment can be obtained as with the sixth embodiment.

Eighth Embodiment

Next, an eighth embodiment will be described. The eighth embodiment will be described mainly in portions different from the first embodiment.

Figure 21:
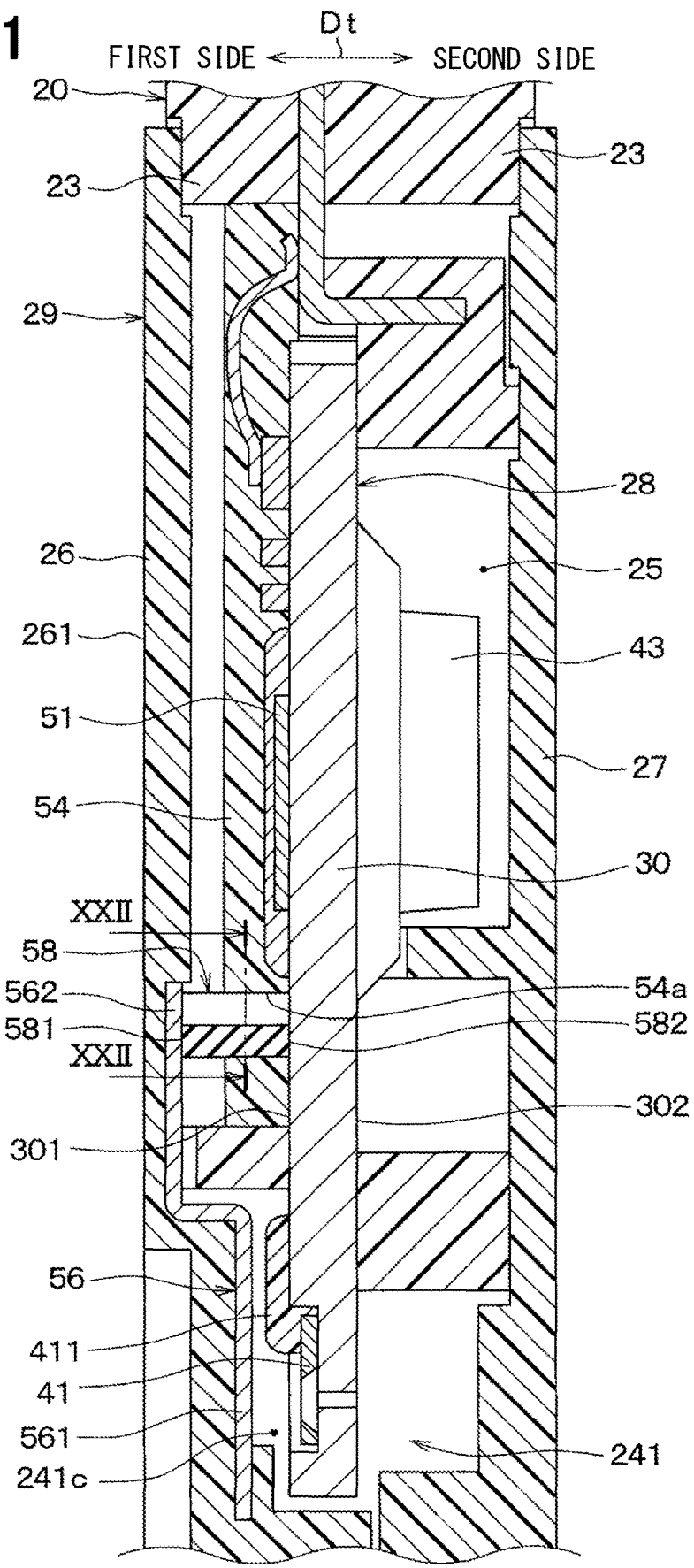
FIG. 21 is a cross-sectional view in an eighth embodiment corresponding to the cross-sectional view of FIG. 6 that is taken along the line VI-VI in FIG. 2.
Figure 22:
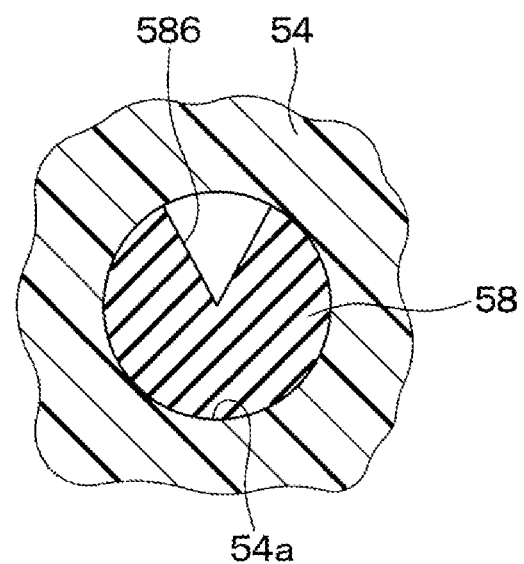
FIG. 22 is a cross-sectional view taken along a line XXII-XXII in FIG. 21.

As shown in FIGS. 21 and 22, the conductive member 58 in this embodiment has a partially cut out cylindrical pillar shape. The conductive member 58 has a cross section that is taken along a line perpendicular to the thickness direction Dt and the cross section is the same in any positions in the thickness direction Dt. That is, the conductive member 58 extends in the thickness direction Dt and has a uniform shape in the cross section entirely in the thickness direction Dt. This embodiment is different from the first embodiment at these points.

Specifically, the conductive member 58 includes a cutout portion 586 cut radially inward from an outer surface of the conductive member 58. The cutout portion 586 extends in the thickness direction Dt along the entire length of the conductive member 58. Thereby, the conductive member 58 includes at least a part distanced away from the covering resin 54. Specifically, a part of the conductive member 58 is distanced away from the covering resin 54 in this embodiment. In this embodiment, the covering resin 54 does not extend into the cutout portion 586 of the conductive member 58, so that the cutout portion 586 defines a simple space.

Because of the configurations of the conductive member 58 described above, even when the conductive member 58 expands or contracts along with a temperature change, the expansion and the contraction can be released at the part of the conductive member 58 that is distanced away from the covering resin 54 (i.e., the space defined by the cutout portion 586). Thus, a stress applied to the conductor 56 and the circuit board 30 from the conductive member 58 in response to the temperature change is relaxed and the reliability of the electric connection between the conductor 56 and the circuit board 30 through the conductive member 58 can be improved.

Since a stress applied to the covering resin 54 in response to an expansion and a contraction of the conductive member 58 can be relaxed, the LSI 51 is restricted from being deformed and an accuracy of measuring a flow rate can be improved. Additionally, it is possible to restrict a deterioration of a soldering between the circuit board 30 and mounting components such as the LSI 51 for the electric connection, which leads to improve the reliability of the physical quantity detector 10.

Aside from the above described embodiments, this embodiment is substantially the same with the first embodiment. In this embodiment, advantaged obtained from the common configuration with the first embodiment can be obtained as with the first embodiment.

Ninth Embodiment

Next, a ninth embodiment will be described. In this embodiment, different portions from the first embodiment will be mainly described.

Figure 23:
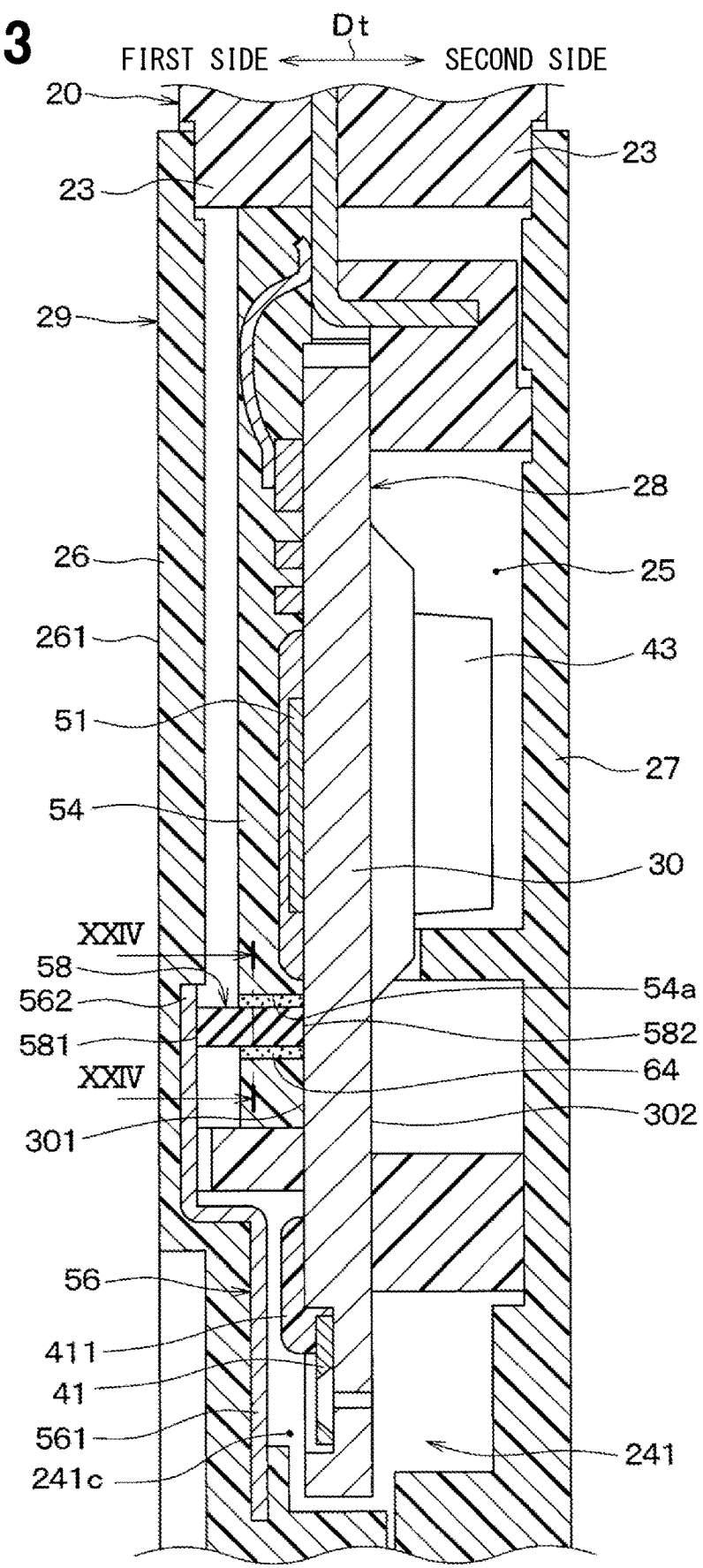
FIG. 23 is a cross-sectional view in a ninth embodiment corresponding to the cross-sectional view of FIG. 6 that is taken along the line VI-VI in FIG. 2.
Figure 24:
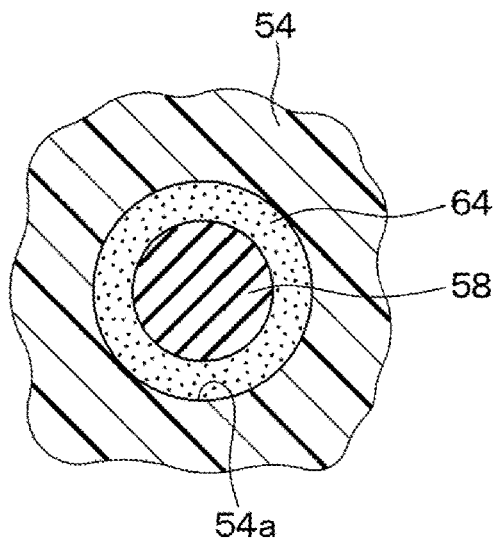
FIG. 24 is a cross-sectional view taken along a line XXIV-XXIV in FIG. 23.

As shown in FIGS. 23 and 24, the conductive member 58 in this embodiment has a cylindrical pillar shape having an axial direction in the thickness direction Dt. Thus, the conductive member 58 extends in the thickness direction Dt and has a uniform shape in a cross section entirely in a length of the conductive member 58 in the thickness direction Dt. A flexible portion 64 is disposed between the conductive member 58 and the covering resin 54. This embodiment is different from the first embodiment in this respect.

Specifically, the flexible portion 64 has an elastic modulus that is lower than the elastic modulus of the conductive member 58. In other words, the flexible portion 64 is softer than the conductive member 58. For example, the flexible portion 64 has a sponge shape. That is, the flexible portion 64 is made of a foamed material such as a foam resin including fine bubbles, thereby the flexible portion 64 has the elastic modulus that is lower than that of the conductive member 58. The flexible portion 64 can be made by blow molding or solidifying the potting resin.

The flexible portion 64 is formed into a tube shape and is in contact with the first board surface 301. The conductive member 58 is inserted into the flexible portion 64. Thus, the flexible portion 64 is disposed between the conductive member 58 and the covering resin 54 to surround an entire circumference of the conductive member 58. As a result, the conductive member 58 has at least a part distanced away from the covering resin 54. Specifically in this embodiment, an entire of the conductive member 58 is distanced away from the covering resin 54. Since the conductive member 58 in this embodiment includes the common configurations with the conductive member 58 in the eighth embodiment, advantages based on the common configurations can be obtained as with the eighth embodiment. That is, even when the conductive member 58 expands or contracts in response to a temperature change, the expansion and the contraction can be released from a part of the conductive member 58 distanced away from the covering resin 54 (i.e., a part in contact with the flexible portion 64). Thus, a stress, along with the temperature change, applied to the conductor 56 and the circuit board 30 from the conductive member 58 can be relaxed and the reliability of the electrical connection between the conductor 56 and the circuit board 30 through the conductive member 58 can be improved.

Aside from the above described aspects, this embodiment is substantially the same with the first embodiment. In this embodiment, advantages obtained from the common configurations with the first embodiment can be obtained as with the first embodiment.

OTHER EMBODIMENTS (1) As shown in FIG. 7, in the first embodiment, each of the first end 581 and the second end 582 has the contact portion 581a, 582a and the contactless portion 581b, 582b, but this is an example. For example, only one of the first end 581 and the second end 582 of the conductive member 58 may have the contact portion 581a, 582a and the contactless portion 581b, 582b. The other of the first end 581 and the second end 582 may be in entirely contact with the contact target without including the contactless portion 581b, 582b.

(2) In the first embodiment described above, the sub passage 24 has a shape as illustrated in FIGS. 3 and 4, but this is one example. The shape of the sub passage 24 may be other shapes.

(3) In embodiments described above, as shown in FIGS. 3 and 4, the circuit board assembly 28 includes the multiple detecting elements 41, 42, 43, and 44, but the number and the kinds of the detecting elements 41, 42, 43, and 44 can be variously considered.

(4) As shown in FIGS. 1 and 2, in the embodiments described above, the physical quantity detector 10 is applied for the control system of the internal combustion engine, but the physical quantity detector 10 may be applied for various systems other than the control system of the internal combustion engine.

(5) The first embodiment described above does not mention a thermal conductivity of the conductive member 58 and the covering resin 54, but a thermal conductivity of the conductive member 58 may be higher than a thermal conductivity of the covering resin 54, for example.

In this case, a heat generated by the LSI 51 is more likely to be dissipated from the conductor 56 through the wiring pattern of the circuit board 30 and the conductive member 58. Thus, the heat is less likely to be transmitted to other electronic components through the covering resin 54. Therefore, since an influence of the heat generated by the LSI 51 on the detecting elements 41 to 44 can be reduced, an accuracy of measuring the physical quantities such as a flow rate, a temperature, a relative humidity, and a pressure of the target fluid can be improved.

(6) The first embodiment does not mention a difference between an elastic modulus of the conductive member 58 and an elastic modulus of the covering resin 54. For example, the elastic modulus of the covering resin 54 may be less than that of the conductive member 58. In other words, the covering resin 54 may be softer than the conductive member 58.

In this case, the conductive member 58 is restricted from being damaged due to the expansion and the contraction of the covering resin 54 along with the temperature change. In addition, the electrical connection between the conductor 56 of the conductive member 58 and the connecting portion 562 and/or the electrical connecting between the conductive member 58 and the circuit board 30 is restricted from being damaged due to the expansion and the contraction of the covering resin 54.

(7) As show in FIG. 6, in the embodiments described above, the first cover 26 is molded by insert molding using the conductor 56 as an insert, but this is an example. For example, the first cover 26 may be molded by a method other than insert molding and the conductor 56 may be fixed to the first cover 26 that has been molded.

(8) As shown in FIG. 6, in the embodiments described above, the housing 20 is molded by insert molding using the circuit board assembly 28 as an insert, but this is an example. For example, the housing 20 may be formed by a method other than insert molding and the circuit board assembly 28 may be fixed to the housing body 23 of the housing 20 that has been molded.

Figure 8:
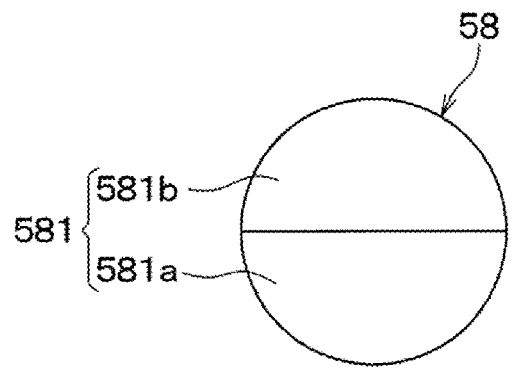
FIG. 8 is a schematic view of a first end of the conductive member viewed in a direction of an arrow VIII in FIG. 7.

(9) In the first embodiment described above, the conductive member 58 has a shape as illustrated in FIGS. 7 to 9 in a free state, but the shape of the conductive member 58 is not limited to this. The conductive member 58 may have shapes illustrated in FIGS. 25A through 33C.

Figure 25A:
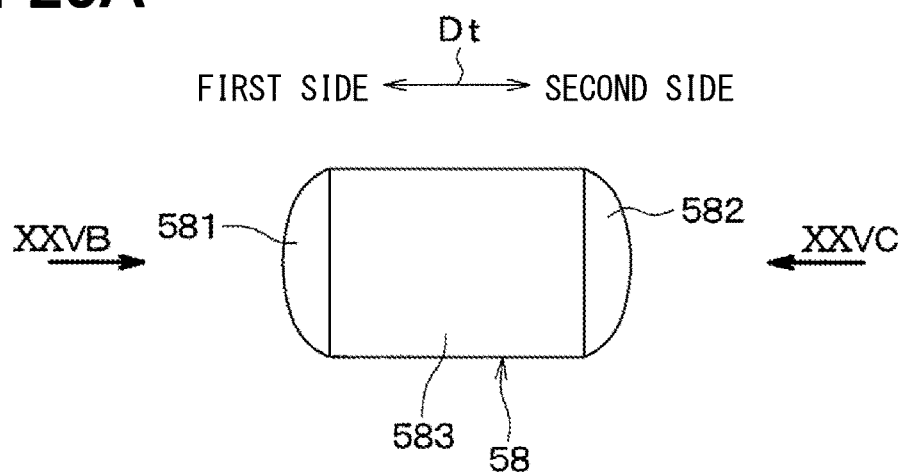
FIG. 25A is a front view of a conductive member in a first example of the first embodiment corresponding to FIG. 7.
Figure 25B:
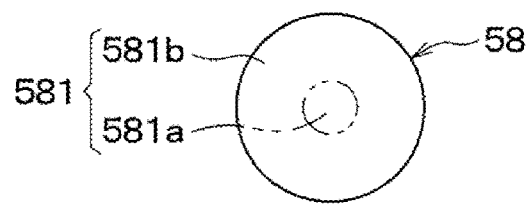
FIG. 25B is a schematic view viewed in a direction of an arrow XXVB in FIG. 25A.

In an example shown in FIGS. 25A and 25B, the first end 581 of the conductive member 58 expands in the thickness direction Dt. The second end 582 of the conductive member 58 also expands in the thickness direction Dt. FIG. 25B is a schematic view viewed in a direction of an arrow XXVB in FIG. 25A and a view viewed in a direction of an arrow XXVC is the same as the schematic view in FIG. 25B, thereby omitting the view in the direction of the arrow XXVC.

In the example shown in FIGS. 25A and 25B, the first end 581 of the conductive member 58 is pressed in the thickness direction Dt in the physical quantity detector 10. Thus, the first end 581 of the conductive member 58 has a certain degree of a contact area as shown in a chain two-dashed line in FIG. 25B. In this respect, the second end 582 of the conductive member 58 is similar to the first end 581.

Figure 26A:
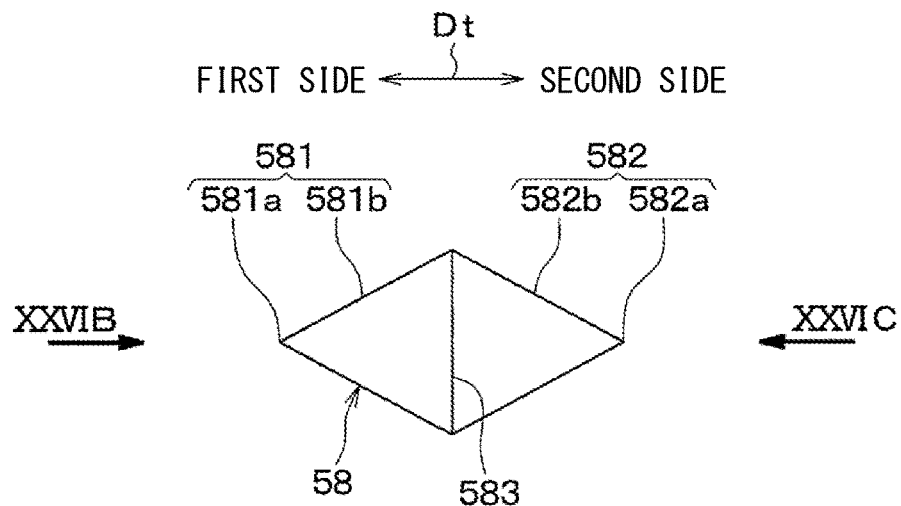
FIG. 26A is a front view of a conductive member in a second example of the first embodiment corresponding to FIG. 7.
Figure 26B:
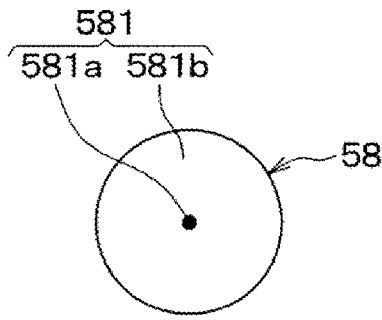
FIG. 26B is a schematic view viewed in a direction of an arrow XXVIB in FIG. 26A.

In an example shown in FIGS. 26A and 26B, the first end 581 of the conductive member 58 sharply protrudes in the thickness direction Dt. The second end 582 of the conductive member 58 is similar to the first end 581. FIG. 26B is a schematic view viewed in a direction of an arrow XXVIB in FIG. 26A and a view viewed in a direction of an arrow XXVIC in FIG. 26A is the same with the schematic view in FIG. 26B, thereby omitting the view in the direction of the arrow XXVIC.

Figure 27:
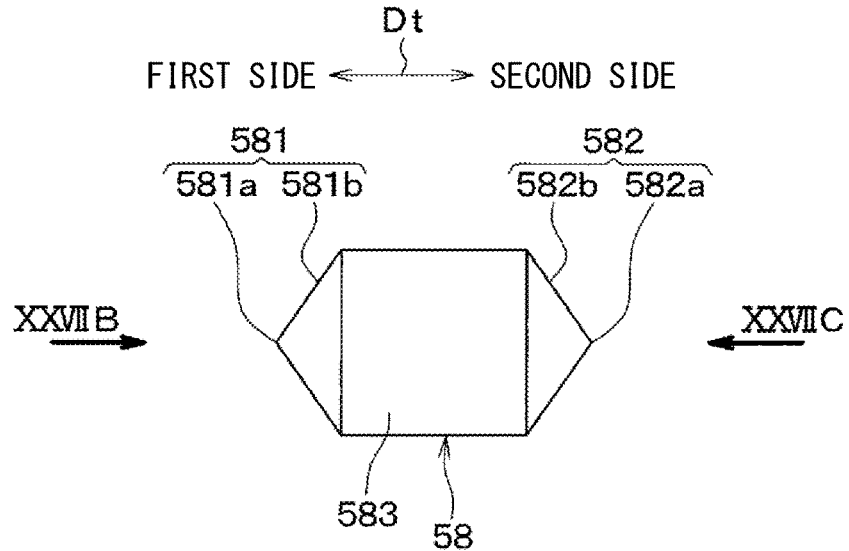
FIG. 27 is a front view of a conductive member in a third example of the first embodiment corresponding to FIG. 7.

An example shown in FIG. 27 is different from the example shown in FIGS. 26A and 26B at the point that the thickest portion 583 of the conductive member 58 extends in the thickness direction Dt into a cylindrical pillar shape. Aside from this aspect, the example in FIG. 27 is substantially the same with the example shown in FIGS. 26A and 26B. A view viewed in a direction of an arrow XXVIIB in FIG. 27 and a view viewed in a direction of an arrow XXVIIC in FIG. 27 are the same with the view in FIG. 26B, thereby omitting the views in the directions of the arrow XXVIIB and the arrow XXVIIC in FIG. 27.

Figure 28A:
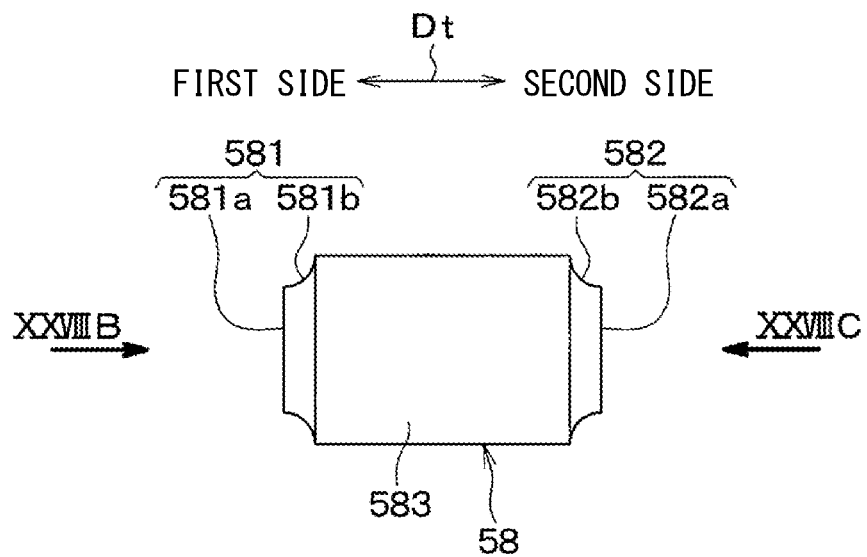
FIG. 28A is a front view of a conductive member in a fourth example of the first embodiment corresponding to FIG. 7.
Figure 28B:
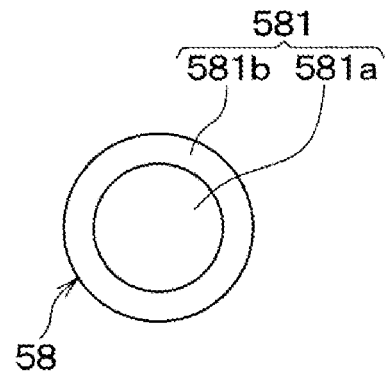
FIG. 28B is a schematic view viewed in a direction of an arrow XXVIIIB in FIG. 28A.

In an example shown in FIG. 28A and FIG. 28B, the first end 581 of the conductive member 58 includes a flat end surface at a center portion of the first end 581 and the flat end portion protrudes relative to an outer peripheral portion of the first end 581 in the thickness direction Dt. The second end 582 of the conductive member 58 is the same with the first end 581. FIG. 28B is a schematic view viewed in a direction of an arrow XXVIIIB in FIG. 28A and a view viewed in the direction of the arrow XXVIIIC in FIG. 28A is the same with the schematic view in FIG. 28B, thereby omitting the view in the direction of the arrow XXVIIIC.

Figure 29A:
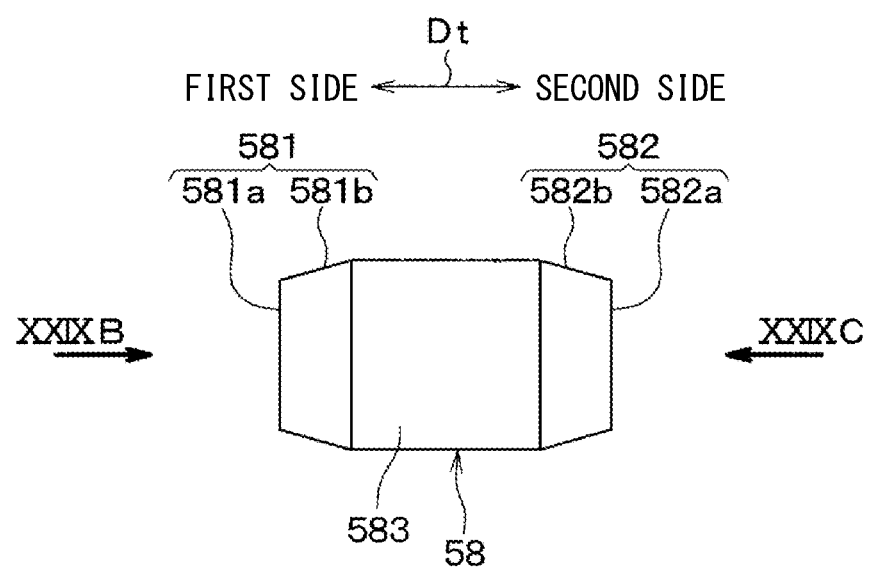
FIG. 29A is a front view of a conductive member in a fifth example of the first embodiment corresponding to FIG. 7.
Figure 29B:
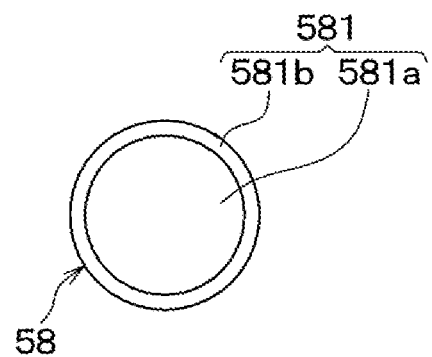
FIG. 29B is a schematic view viewed in a direction of an arrow XXIXB in FIG. 29A.

An example shown in FIGS. 29A and 29B is different from the example shown in FIGS. 28A and 28B at a point that the first contactless portion 581b and the second contactless portion 582b are tapered. Aside from this point, the example shown in FIGS. 29A and 29B is the same with the example shown in FIGS. 28A and 28B. FIG. 29B is a schematic view viewed in a direction of an arrow XXIXB in FIG. 29A and a view viewed in the direction of the arrow XXIXC in FIG. 29A is the same with the schematic view in FIG. 29B, thereby omitting the view viewed in the direction of the arrow XXIXC.

Figure 30A:
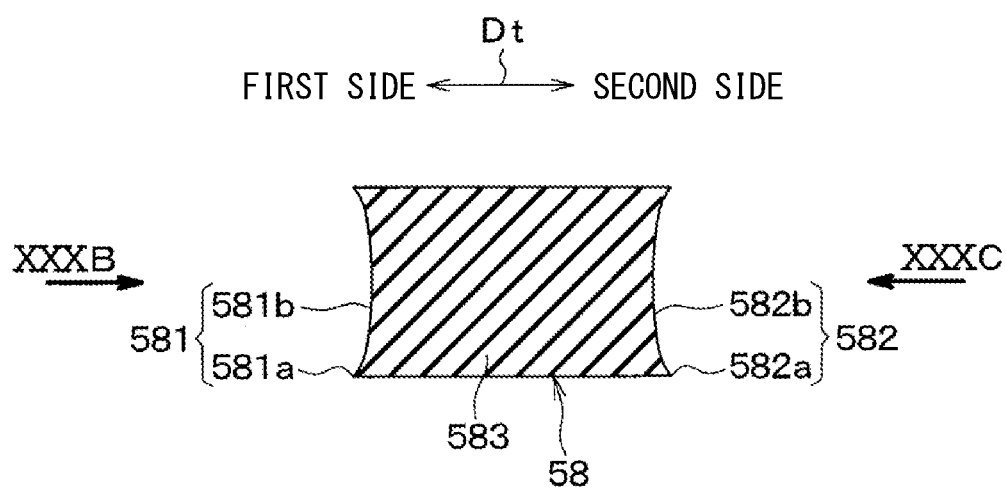
FIG. 30A is a cross-sectional view of a conductive member in a sixth example of the first embodiment corresponding to FIG. 7.
Figure 30B:
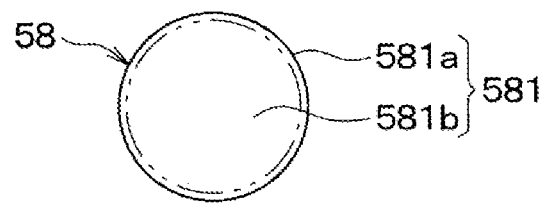
FIG. 30B is a schematic view viewed in a direction of an arrow XXXB in FIG. 30A.

In an example shown in FIGS. 30A and 30B, the first end 581 of the conductive member 58 has a shape such that a center portion of the first end 581 is recessed in the thickness direction Dt. The second end 582 of the conductive member 58 is the same with the first end 581. FIG. 30B is a schematic view viewed in a direction of an arrow XXXB in FIG. 30A and a view viewed in a direction of an arrow XXXC in FIG. 30A is the same as the schematic view in FIG. 30B, thereby omitting the view viewed in the direction of the arrow XXXC. In FIG. 30B, a chain two-dashed line is illustrated along the first contact portion 581a for descriptive purposes.

Figure 31A:
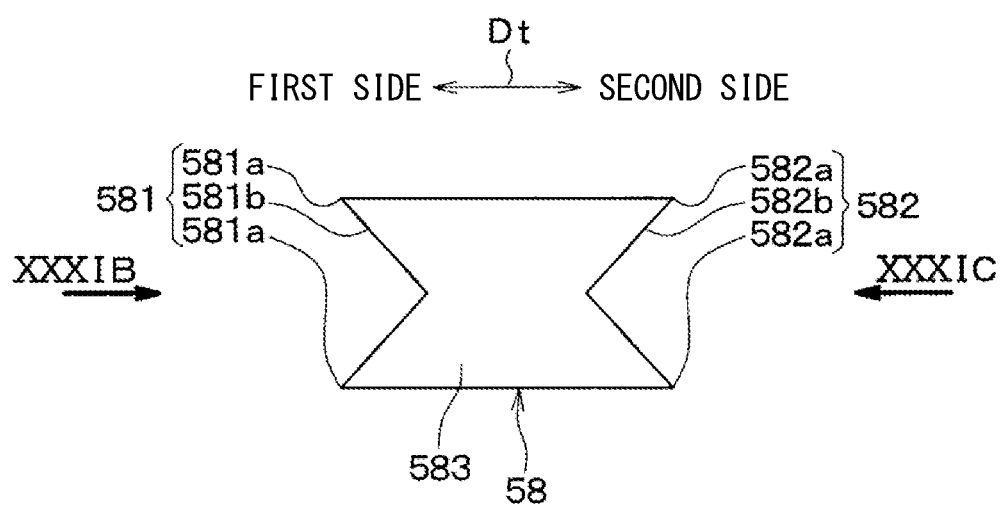
FIG. 31A is a front view of a conductive member in a seventh example of the first embodiment corresponding to FIG. 7.
Figure 31B:
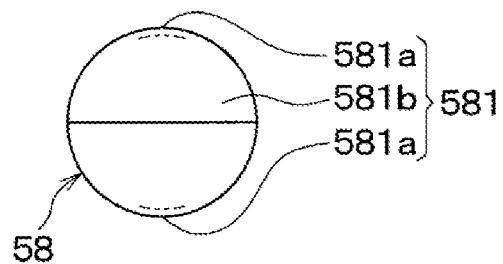
FIG. 31B is a schematic view viewed in a direction of an arrow XXXIB in FIG. 31A.

In an example shown in FIGS. 31A and 31B, the first end 581 of the conductive member 58 includes a V-shaped notch. Thus, the first end 581 has a pair of sharp protrusions and each of the sharp protrusions serves as the first end contact portion 581a. The second end 582 of the conductive member 58 has a shape similar to that of the first end 581. FIG. 31B is a schematic view viewed in a direction of an arrow XXXIB in FIG. 31A and a view viewed in a direction of an arrow XXXXIC in FIG. 31A is similar to the schematic view in FIG. 31B, thereby omitting the view viewed in the direction of the arrow XXXIC. In FIG. 31B, a chain two dashed line is illustrated along the first contact portion 581a for descriptive purposes.

Figure 32A:
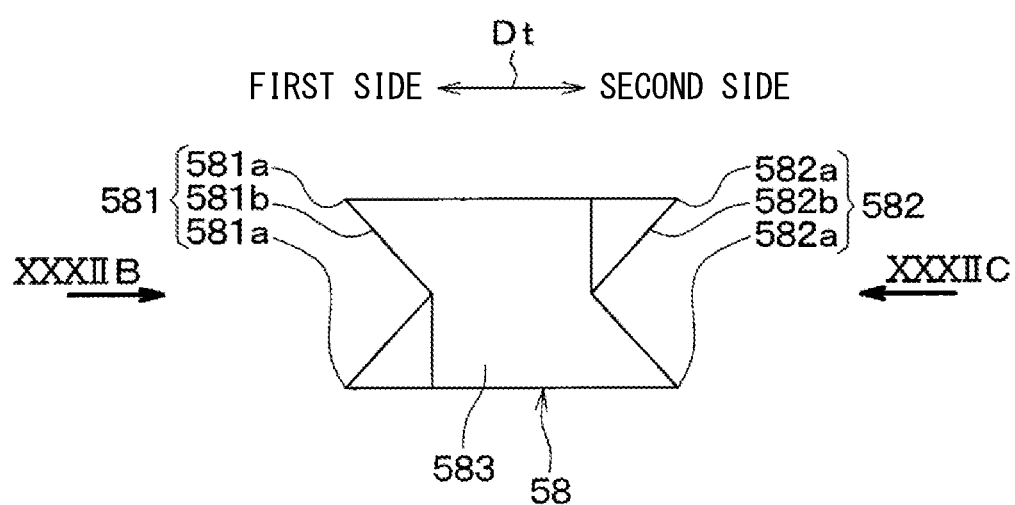
FIG. 32A is a front view of a conductive member in an eighth example of the first embodiment corresponding to FIG. 7.
Figure 32B:
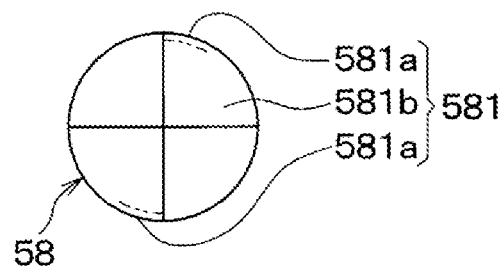
FIG. 32B is a schematic view viewed in a direction of an arrow XXXIIB in FIG. 32A.

In an example shown in FIGS. 32A and 32B, the pair of protrusions of the first end 581 has a shape smaller than a shape of the pair of protrusions in the example shown in FIGS. 31A and 31B when viewed in the thickness direction Dt. Thus, the first end contact portion 581a is smaller than that in the example shown in FIGS. 31A and 31B when viewed in the thickness direction Dt. Aside from this, the example shown in FIGS. 32A and 32B are similar to the example shown in FIGS. 31A and 31B. FIG. 32B is a schematic view viewed in a direction of an arrow XXXIIB in FIG. 32A and a view viewed in a direction of an arrow XXXIIC in FIG. 32A is the same with the schematic view in FIG. 32B, thereby omitting the view viewed in the direction of the arrow XXXIIC. In FIG. 32B, a chain two-dashed line is illustrated along the first contact portion 581a for descriptive purposes.

Figure 33A:
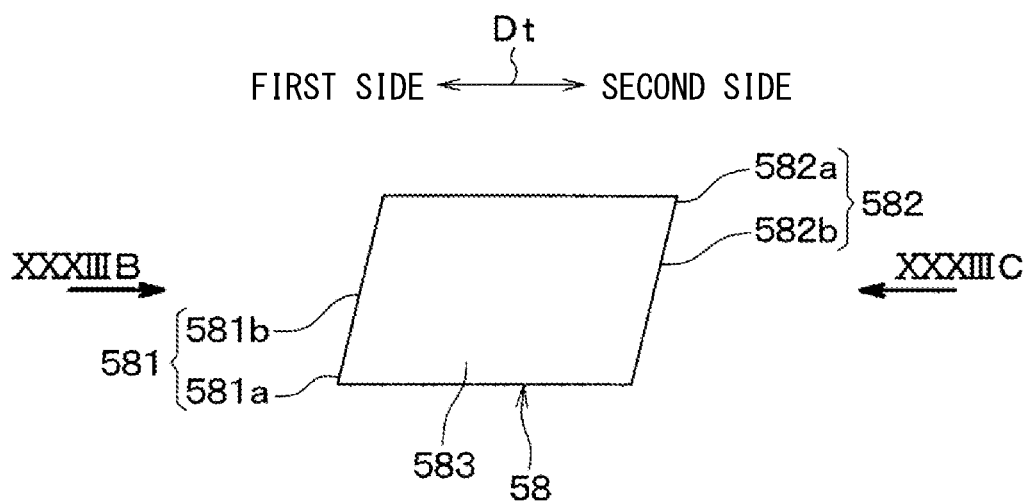
FIG. 33A is a front view of a conductive member in a ninth example of the first embodiment corresponding to FIG. 7.
Figure 33B:
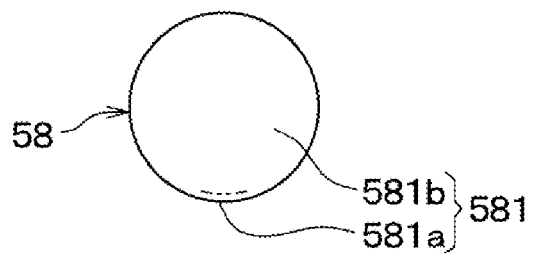
FIG. 33B is a schematic view viewed in a direction of an arrow XXXIIIB in FIG. 33A.
Figure 33C:
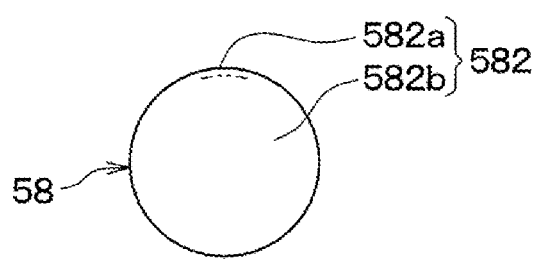
FIG. 33C is a schematic view viewed in a direction of an arrow XXXIIIC in FIG. 33A.

In an example shown in FIGS. 33A through 33C, the conductive member 58 has a cylindrical pillar shape having an axial direction in the thickness direction Dt and each of the first end 581 and the second end 582 includes an end surface tilted relative to the axial direction of the cylindrical pillar shape. In FIG. 33B, a chain two-dashed line is illustrated along the first contact portion 581a and in FIG. 33C, a chain two-dashed line is illustrated along the second contact portion 582a.

(10) In the first embodiment described above, a manufacturing method for the conductive member 58 can be variously considered, but the conductive member 58 may be manufactured by injection molding with a metal mold. This also applies to the modified examples shown in FIGS. 25A to 33C.

Figure 34A:
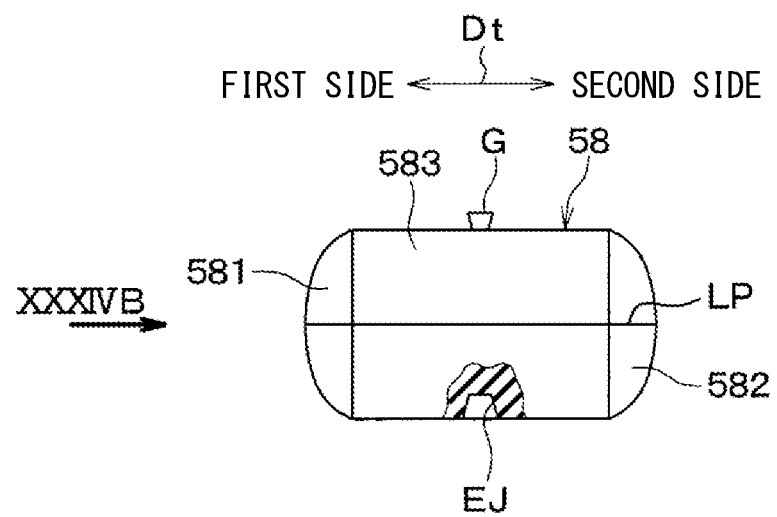
FIG. 34A is a front view of the conductive member, corresponding to FIG. 25A, in the first example of the first embodiment illustrating a gate, a mold parting line, and an injector mark.
Figure 34B:
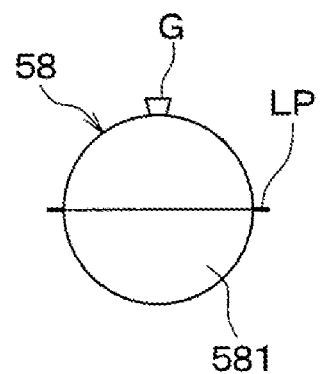
FIG. 34B is a schematic view viewed in a direction of an arrow XXXIVB in FIG. 34A.

When the conductive member 58 is manufactured by injection molding, as shown in FIGS. 34A and 34B, an ejector pin mark EJ that is a mark of an ejector pin, a gate G, and a parting line LP appear on a surface of the conductive member 58 as dots or lines. The conductive member 58 may have the ejector pin mark EJ, the gate G, and the parting line. FIGS. 34A and 34B are schematic views illustrating the conductive member 58 shown in FIGS. 25A and 25B having the ejector pin mark EJ, the gate G, and the parting line LP. In FIG. 34A, a vicinity of the ejector mark pin EJ is partially shown in a cross section.

Figure 35:
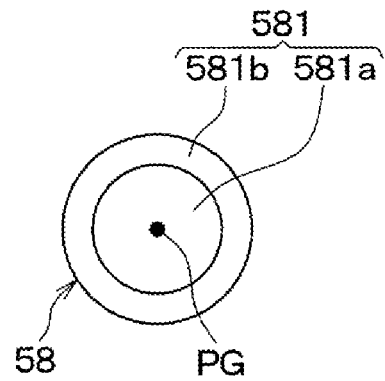
FIG. 35 is a schematic view in the fourth example of the first embodiment illustrating a pin gate PG in place of the gate G in FIG. 34A and corresponding to FIG. 28B.
Figure 36:
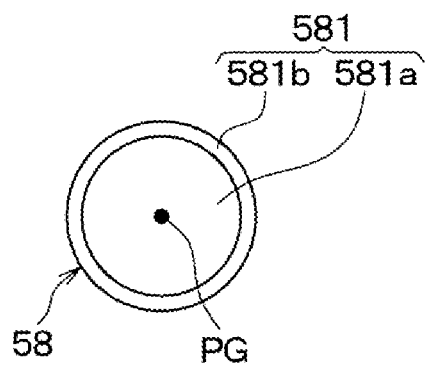
FIG. 36 is a schematic view in the fifth example of the first embodiment illustrating the pin gate PG in place of the gate G in FIG. 34A and corresponding to FIG. 29B.
Figure 37:
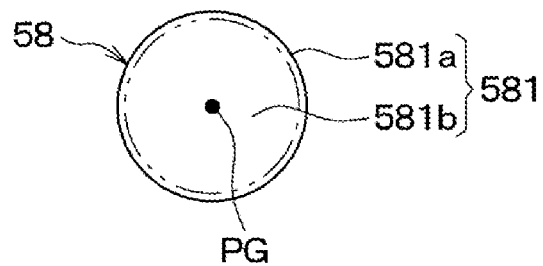
FIG. 37 is a schematic view in the sixth example of the first embodiment illustrating the pin gate PG in place of the gate G in FIG. 34A and corresponding to FIG. 30B.

In the example shown in FIGS. 28A and 28B, when the conductive member 58 is manufactured by injection molding, the conductive member 58 may have a pin gate PG shown in FIG. 35 in place of the gate G shown in FIG. 34A. This also applies to the example shown in FIGS. 29A and 29B as illustrated in FIG. 36 and to the example shown in FIGS. 30A and 30B as illustrated in FIG. 37. It is preferable that the pin gate PG shown in FIGS. 35 through 37 does not have a convex shape on the conductive member 58.

Figure 38:
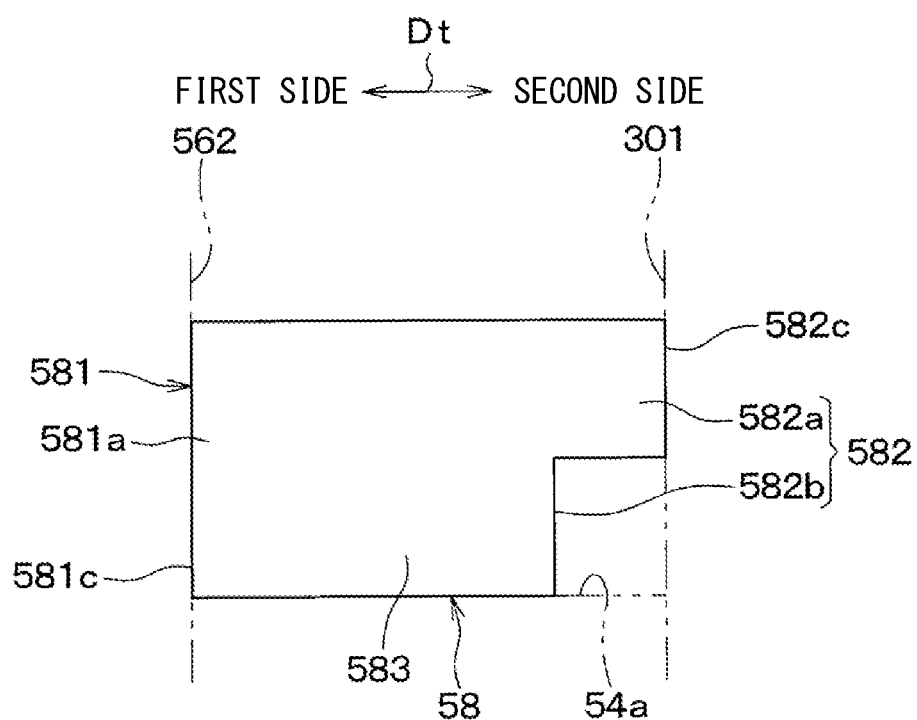
FIG. 38 is a schematic view, corresponding to FIG. 7, illustrating a state in which a first end of a conductive member in a tenth example of the first embodiment does not include a contactless portion.

(11) As shown in FIG. 7, in the first embodiment, both the first end 581 and the second end 582 of the conductive member 58 have the contactless portions 581b and 582b, but this is an example. For example, as shown in FIG. 38, one of the first end 581 and the second end 582 may have the contact portion 581a, 582a and may not have the contactless portion 581b, 582b. In FIG. 38, the first end 581 of the conductive member 58 does not have the first contactless portion 581b.

(12) In the first embodiment, the conductive member 58 shown in FIG. 6 electrically connects the connecting portion 562 of the conductor 56 to the circuit board 30 while being compressed between the connecting portion 562 and the circuit board 30 in the thickness direction Dt. The conductive member 58 needs to electrically connect the connecting portion 562 to the circuit board 30. That is, the conductive member 58 may be in contact with the connecting portion 562 to the circuit board 30 without being compressed therebetween.

(13) The present disclosure is not limited to the embodiments described above and can be variously modified. The above embodiments are not independent of each other, and can be appropriately combined together except when the combination is obviously impossible.

Further, in each of the above-mentioned embodiments, it goes without saying that components of the embodiment are not necessarily essential except for a case in which the components are particularly clearly specified as essential components, a case in which the components are clearly considered in principle as essential components, and the like. A quantity, a value, an amount, a range, or the like, if specified in the above-described example embodiments, is not necessarily limited to the specific value, amount, range, or the like unless it is specifically stated that the value, amount, range, or the like is necessarily the specific value, amount, range, or the like, or unless the value, amount, range, or the like is obviously necessary to be the specific value, amount, range, or the like in principle. Further, in each of the embodiments described above, when materials, shapes, positional relationships, and the like, of the components and the like, are mentioned, they are not limited to these materials, shapes, positional relationships, and the like, unless otherwise specified and unless limited to specific materials, shapes, positional relationships, and the like.

What is claimed is:

1. A physical quantity detector configured to detect a physical quantity of a target fluid, the physical quantity detector comprising:
    a housing;
    a circuit board disposed in the housing and including a board surface that faces in a thickness direction of the circuit board;
    a cover disposed to face the board surface in the thickness direction and defining, together with the hosing, a passage through which the target fluid flows;
    a resin member disposed between the cover and the circuit board and covering the board surface;
    a conductor including:
        a passage side portion disposed in the passage; and
        a connecting portion disposed to face the board surface of the circuit board in the thickness direction; and
    a conductive member inserted and fit into the resin member in the thickness direction, the conductive member electrically connecting the connecting portion to the circuit board by being disposed between the connecting portion and the circuit board to be in contact with both the connecting portion and the circuit board, wherein
    the conductive member includes a first end in the thickness direction facing a contact target that is either one of the connecting portion or the board surface, and
    the first end includes:
        a contact portion that is in contact with the contact target; and
        a contactless portion that is distanced away from the contact target in the thickness direction.

2. The physical quantity detector according to claim 1, wherein
    the conductive member includes:
        a second end opposite to the first end in the thickness direction; and
        a thickest portion disposed between the first end and the second end and having a maximum cross-sectional area in the conductive member that is taken along a line perpendicular to the thickness direction,
    the contact portion has a contact area with the contact target, and
    the contact area is smaller than the maximum cross-sectional area of the thickest portion.

3. The physical quantity detector according to claim 1, wherein
the contact target is the board surface, and
the board surface includes a protrusion that protrudes to the contact portion to be in contact with the contact portion.

4. The physical quantity detector according to claim 1, wherein
the contact target is the connecting portion, and
the connecting portion includes a protrusion that protrudes to the contact portion to be in contact with the contact portion.

5. The physical quantity detector according to claim 1, wherein
the conductive member has a thermal conductivity greater than that of the resin member.

6. The physical quantity detector according to claim 1, wherein
the resin member has an elastic modulus that is lower than that of the conductive member.

7. A physical quantity detector configured to detect a physical quantity of a target fluid, the physical quantity detector comprising:
a housing;
a circuit board disposed in the housing and including a board surface that faces in a thickness direction;
a cover disposed to face the board surface in the thickness direction and defining, together with the housing, a passage through which the target fluid flows;
a resin member disposed between the cover and the circuit board and covering the board surface;
a conductor fixed to the cover and including:
a passage side portion disposed in the passage; and
a connecting portion disposed to face the board surface of the circuit board in the thickness direction; and
a conductive member inserted and fit into the resin member in the thickness direction, the conductive member electrically connecting the connecting portion to the circuit board by being disposed between the connecting portion and the circuit board to be in contact with both the connecting portion and the circuit board, wherein
the cover is configured to allow the connecting portion of the conductor to be bent in the thickness direction away from the circuit board.

8. The physical quantity detector according to claim 7, wherein
the connecting portion includes an end of the conductor that is located away from the passage side portion, and
the end is distanced away from the cover to define a connecting portion vicinity gap between the connecting portion and the cover.

9. The physical quantity detector according to claim 8, wherein
the connecting portion vicinity gap expands beyond the connecting portion when viewed in the thickness direction.

10. The physical quantity detector according to claim 7, further comprising
a member made of a material with an elastic modulus that is lower than that of the conductive member, wherein
the connecting portion is distanced away from the cover and includes an end of the conductor that is located away from the passage side portion, and
the member is disposed between the connecting portion and the cover.

11. A physical quantity detector configured to detect a physical quantity of a target fluid, the physical quantity detector comprising:
a housing;
a circuit board disposed in the housing and including a board surface that faces in a thickness direction;
a cover disposed to face the board surface in the thickness direction and defining, together with the housing, a passage through which the target fluid flows;
a resin member disposed between the cover and the circuit board and covering the board surface;
a conductor fixed to the cover and including:
a passage side portion disposed in the passage; and
a connecting portion disposed to face the board surface of the circuit board in the thickness direction, the connecting portion defining a connecting hole that passes through the conductor between a first surface facing away from the circuit board and a second surface facing the circuit board in the thickness direction; and
a conductive member inserted into the resin member in the thickness direction and electrically connecting the connecting portion to the circuit board, wherein
the conductive member includes a conductive solidified portion joined to both the connecting portion and the circuit board by being solidified in a space between the connecting portion and the circuit board, and
the conductive solidified portion is inserted into the connecting hole and protrudes from the first surface of the connecting portion in the thickness direction.

12. The physical quantity detector according to claim 11, wherein
the cover includes an outer surface facing away from the circuit board in the thickness direction,
the outer surface defines a cover hole passing through the cover in the thickness direction,
the conductive solidified portion includes a protrusion protruding from the first surface of the conductor in the thickness direction and located in the cover hole, and
the protrusion has a peak located between the outer surface and the first surface of the connecting portion in the thickness direction.

13. The physical quantity detector according to claim 11, wherein
the conductive solidified portion is made by solidifying a conductive adhesive.

14. The physical quantity detector according to claim 11, wherein
the conductive member includes a frame defining a frame hole that passes through the frame in the thickness direction,
the frame is disposed between the connecting portion and the board surface and in contact with the board surface, and
the conductive solidified portion is inserted into the frame hole and is in contact with both the connecting portion and the board surface.

15. A physical quantity detector configured to detect a physical quantity of a target fluid, the physical quantity detector comprising:
a housing;
a circuit board disposed in the housing and including a board surface that faces in a thickness direction;
a cover disposed to face the board surface in the thickness direction and defining, together with the housing, a passage through which the target fluid flows;

a resin member disposed between the cover and the circuit board and covering the board surface;
a conductor including:
  a passage side portion disposed in the passage; and
  a connecting portion disposed to face the board surface of the circuit board in the thickness direction; and
a conductive member inserted into the resin member in the thickness direction, the conductive member electrically connecting the connecting portion to the circuit board by being disposed between the connecting portion and the circuit board to be in contact with both the connecting portion and the circuit board, wherein
the conductive member includes at least a part distanced away from the resin member.

16. The physical quantity detector according to claim 15, further comprising
a flexible portion disposed between the conductive member and the resin member, wherein
the flexible portion has an elastic modulus that is lower than that of the conductive member.

17. The physical quantity detector according to claim 16, wherein
the flexible portion contains fine bubbles that cause the elastic modulus of the flexible portion to be lower than that of the conductive member.

* * * * *